US012696663B2

(12) United States Patent
Hyun et al.

(10) Patent No.: US 12,696,663 B2
(45) Date of Patent: Jul. 28, 2026

(54) DISPLAY DEVICE AND METHOD OF MANUFACTURING THE SAME

(71) Applicant: Samsung Display Co., Ltd., Yongin-si (KR)

(72) Inventors: Jinho Hyun, Yongin-si (KR); Woo Yong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 415 days.

(21) Appl. No.: 18/130,646

(22) Filed: Apr. 4, 2023

(65) Prior Publication Data

US 2023/0345800 A1 Oct. 26, 2023

(30) Foreign Application Priority Data

Apr. 20, 2022 (KR) ........................ 10-2022-0049052

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
None
See application file for complete search history.

(56) References Cited

U.S. PATENT DOCUMENTS

| | | | | |
|---|---|---|---|---|
| 2014/0066573 A1* | 3/2014 | Kim | ...................... | C08F 259/00 |
| | | | | 525/199 |
| 2015/0380685 A1* | 12/2015 | Lee | ...................... | H10K 59/122 |
| | | | | 257/40 |
| 2019/0312226 A1* | 10/2019 | Huang | ............... | H10K 59/8731 |

(Continued)

FOREIGN PATENT DOCUMENTS

| | | |
|---|---|---|
| KR | 1020160000853 A | 1/2016 |
| KR | 1020170062856 A | 6/2017 |
| KR | 1020190081724 A | 7/2019 |

OTHER PUBLICATIONS

Gogolides, et al., Controlling roughness: from etching to nanotexturing and plasma-directed organization on organic and inorganic materials, HAL open science, pp. 1 of 20, Aug. 4, 2011.

*Primary Examiner* — Vongsavanh Sengdara
(74) *Attorney, Agent, or Firm* — CANTOR COLBURN LLP

(57) ABSTRACT

A display device divided into a display region and a non-display region adjacent to the display region includes a base layer, a light-emitting element layer, a first inorganic encapsulation film, an organic encapsulation film, a second inorganic encapsulation film, and a hydrophobic coating layer. The second inorganic encapsulation film which covers the organic encapsulation film, and the hydrophobic coating layer which covers an edge region of the first inorganic encapsulation film and is disposed on the first inorganic encapsulation film. The edge region may be defined as a region in which the first inorganic encapsulation film and the (Continued)

second inorganic encapsulation film do not overlap, and in a direction perpendicular to a thickness direction, the organic encapsulation film and the hydrophobic coating layer are spaced apart from each other with the second inorganic encapsulation film therebetween.

11 Claims, 16 Drawing Sheets

(56) References Cited

U.S. PATENT DOCUMENTS

| | | | |
|---|---|---|---|
| 2021/0328184 A1* | 10/2021 | Jung | H10K 59/8722 |
| 2021/0376291 A1* | 12/2021 | Park | H10K 59/88 |
| 2021/0384461 A1* | 12/2021 | Kim | H10K 59/8722 |
| 2022/0093897 A1 | 3/2022 | Lee et al. | |

* cited by examiner

DAM-2  DAM-1  BS  DP-CL  DP-ED  DAM-1  DAM-2

DAP                              DAP

DR3

DR1  DR2

IL1  DAM-2  DAM-1  BS  DP-CL  DP-ED  DAM-1  DAM-2

DAP                              DAP

DR3

DR1  DR2

IL1  DAM-2    DAM-1    BS  DP-CL  DP-ED  DAM-1    DAM-2

DAP                                      DAP

IL1  DAM-2    DAM-1    BS  DP-CL  DP-ED  DAM-1    DAM-2    P-PBL

DAP                                      DAP

DR3
DR1
DR2

1

DISPLAY DEVICE AND METHOD OF MANUFACTURING THE SAME

This application claims priority to Korean Patent Application No. 10-2022-0049052, filed on Apr. 20, 2022, and all the benefits accruing therefrom under 35 U.S.C. § 119, the content of which in its entirety is herein incorporated by reference.

BACKGROUND

1. Field

The disclosure herein relates to a display device including a hydrophobic coating layer disposed on an inorganic encapsulation film and a method of manufacturing the same.

2. Description of the Related Art

A display device may be manufactured through process of forming, on a substrate, a light-emitting element layer, and a circuit layer including a transistor or the like. A protective film or the like is used to protect a light-emitting element layer, etc., during display device manufacturing processes performed in sequence.

SUMMARY

An inkjet printing apparatus, a dispenser or the like is used to provide a large-area protective film, but a protective film formed by the inkjet printing apparatus, the dispenser or the like causes defects such as a residual film.

The disclosure provides a method of manufacturing a display device including forming an upper protective layer through inkjet printing or a dispensing, and a display device with improved reliability manufactured by the method.

An embodiment of the inventive concept provides a display device divided into a display region and a non-display region adjacent to the display region, the display device including a base layer, a light-emitting element layer disposed on the base layer, a first inorganic encapsulation film disposed on the light-emitting element layer, an organic encapsulation film disposed on the first inorganic encapsulation film, a second inorganic encapsulation film which covers the organic encapsulation film and is disposed on the first inorganic encapsulation film, and a hydrophobic coating layer which covers an edge region of the first inorganic encapsulation film and is disposed on the first inorganic encapsulation film. The edge region is defined as a region in which the first inorganic encapsulation film and the second inorganic encapsulation film do not overlap, and in a direction perpendicular to a thickness direction, the organic encapsulation film and the hydrophobic coating layer are spaced apart from each other with the second inorganic encapsulation film therebetween.

In an embodiment, the hydrophobic coating layer may include a fluorine group.

In an embodiment, on a cross section perpendicular to the thickness direction, a width of the first inorganic encapsulation film parallel to the direction may be greater than a width of the second inorganic encapsulation film parallel to the direction.

In an embodiment, on a side parallel to the direction, a difference between the width of the first inorganic encapsulation film and the width of the second inorganic encapsulation film may be about 50 micrometers ($\mu$m) or more.

2

In an embodiment, in the direction, a difference between the width of the first inorganic encapsulation film and the width of the second inorganic encapsulation film may be less than or equal to a width of the hydrophobic coating layer.

In an embodiment, in the edge region, the hydrophobic coating layer may be directly disposed on the first inorganic encapsulation film.

In an embodiment, the organic encapsulation film may not overlap the edge region.

In an embodiment, the hydrophobic coating layer may include a first hydrophobic region overlapping the first inorganic encapsulation film and having a first thickness, and a second hydrophobic region having a second thickness and spaced apart from the second inorganic encapsulation film with the first hydrophobic region therebetween, the first thickness being less than the second thickness.

In an embodiment, the display device may further include a dam structure disposed on the base layer in the non-display region. The first inorganic encapsulation film covers the dam structure.

In an embodiment, the hydrophobic coating layer and the organic encapsulation film may be spaced apart from each other with the dam structure therebetween.

In an embodiment, the hydrophobic coating layer may cover at least a portion of the dam structure.

In an embodiment of the inventive concept, a method of manufacturing a display device, the method including forming, on a substrate, a plurality of preliminary display panels each including a light-emitting element layer, forming a first inorganic encapsulation film on the light-emitting element layer, forming an organic encapsulation film on the first inorganic encapsulation film, forming a preliminary hydrophobic coating layer on the organic encapsulation film, forming a hydrophobic coating layer by removing the preliminary hydrophobic coating layer in a central region of the first inorganic encapsulation film except for an edge region of the first inorganic encapsulation film, forming a second inorganic encapsulation film which covers the organic encapsulation film on the first inorganic encapsulation film that does not overlap the hydrophobic coating layer, forming an upper protective layer on the second inorganic encapsulation film through an inkjet printing method or a dispensing method, and separating each of the plurality of preliminary display panels from the substrate. In a direction perpendicular to a thickness direction, the organic encapsulation film and the hydrophobic coating layer are spaced apart from each other with the second inorganic encapsulation film therebetween.

In an embodiment, the upper protective layer may not overlap the hydrophobic coating layer.

In an embodiment, in the thickness direction, an edge of the upper protective layer may be parallel to an edge of the second inorganic encapsulation film.

In an embodiment, the upper protective layer may include at least one of an epoxy-based compound and an acrylic compound.

In an embodiment, the preliminary hydrophobic coating layer may cover the organic encapsulation film.

In an embodiment, the forming the preliminary hydrophobic coating layer may include providing a hydrophobic gas including a fluorine group.

In an embodiment, the forming the hydrophobic coating layer may include removing the preliminary hydrophobic coating layer through a plasma method.

In an embodiment, in the forming the hydrophobic coating layer, hydrogen gas or nitrogen gas may be provided.

In an embodiment, in the direction, the edge region of the first inorganic encapsulation film may have a width of about 50 μm or more.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
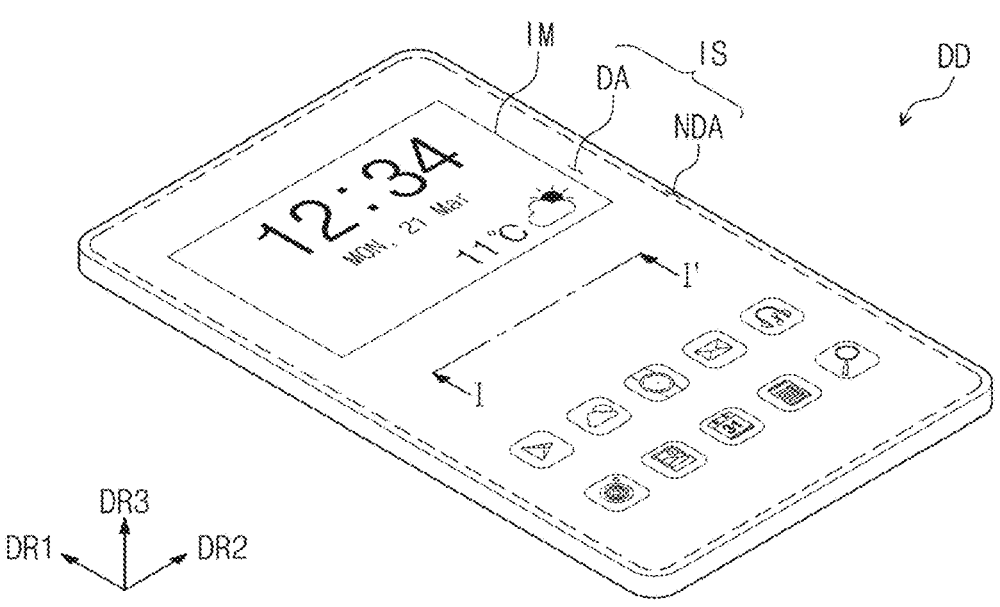
FIG. 1 is a perspective view illustrating an embodiment of a display device.

Embodiments of the disclosure may be implemented in various modifications and have various forms and illustrative embodiments are illustrated in the drawings and described in detail in the text. It is to be understood, however, that the invention is not intended to be limited to the particular forms disclosed, but on the contrary, is intended to cover all modifications, equivalents, and alternatives falling within the spirit and scope of the invention.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like numbers or symbols refer to like elements throughout. Also, in the drawings, the thicknesses, ratios, and dimensions of the elements are exaggerated for effective description of the technical contents. The term "and/or" includes all of one or more combinations which can be defined by related elements.

Although the terms first, second, etc. may be used to describe various elements, these elements should not be limited by these terms. These terms are only used to distinguish one element from another element. A first element may be also referred to as a second element, and similarly, a second element may also be also referred to as a first element without departing from the scope of the disclosure, for example. The singular forms include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skills in the art to which the disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, a display device in an embodiment will be described with reference to the drawings. FIG. 1 is a perspective view illustrating an embodiment of a display device.

A display device DD in an embodiment may be activated in response to an electrical signal. The display device DD may be a flexible device. In an embodiment, the display device DD may be a portable electronic device, a vehicle navigation unit, a game console, a tablet personal computer ("PC"), a personal computer, a notebook computer, or a wearable device, for example, but the inventive concept is not limited thereto. In FIG. 1, the display device DD is illustrated as a mobile electronic device.

The display device DD may display an image IM through a display surface IS. The display surface IS may include a display region DA and a non-display region NDA adjacent to the display region DA. The non-display region NDA may be a region in which the image is not displayed. The non-display region NDA may surround the display region DA. However, the inventive concept is not limited thereto, and at least a portion of the non-display region NDA may be omitted. The display surface IS may include a plane defined by a first direction axis DR1 and a second direction axis DR2.

In this specification, the first direction axis DR1 and the second direction axis DR2 may be perpendicular to each other, and the third direction axis DR3 may be a normal direction of the plane defined by the first direction axis DR1 and the second direction axis DR2. A thickness direction of the display device DD may be parallel to a direction in which the third direction axis DR3 extends. In this specification, a front surface (or a top surface, upper portion) and a rear surface (or a bottom surface, lower portion) of each member constituting the display device DD may be defined with respect to the third direction axis DR3. The wording, "front surface (or a top surface, upper portion)" may mean the surface (or direction) adjacent to the display surface IS, and the wording, "rear surface (or a bottom surface, lower portion)" may mean a surface (or direction) spaced apart from the display surface IS.

The directions indicated by the first to third direction axes DR1, DR2, and DR3 illustrated in this specification may have a relative concept and may thus be changed to other directions. In addition, the directions indicated by the first to third direction axes DR1, DR2, and DR3 may be also referred to as first to third directions, and may thus be denoted as the same reference numerals or symbols.

Figure 2:
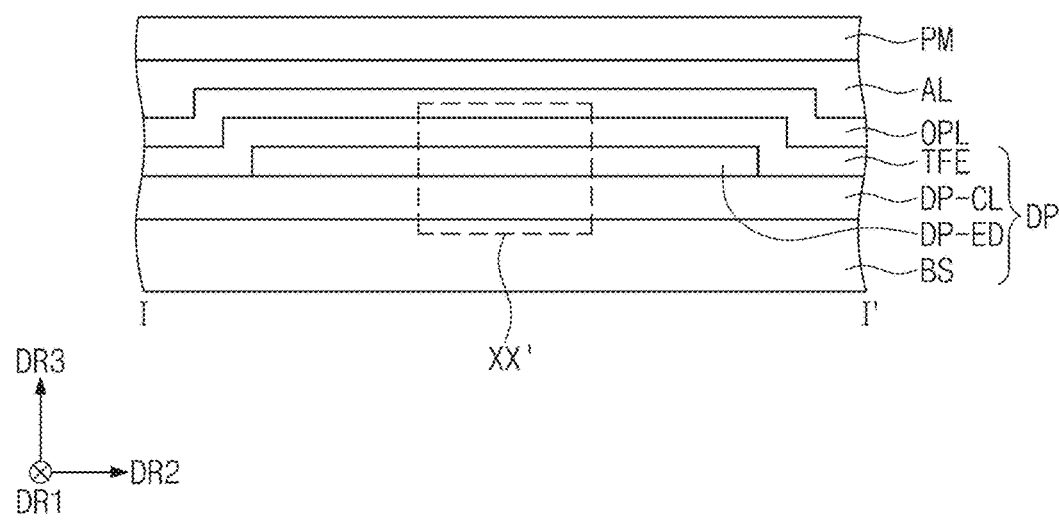
FIG. 2 is a cross-sectional view taken along line I-I' of FIG. 1.
Figure 3:
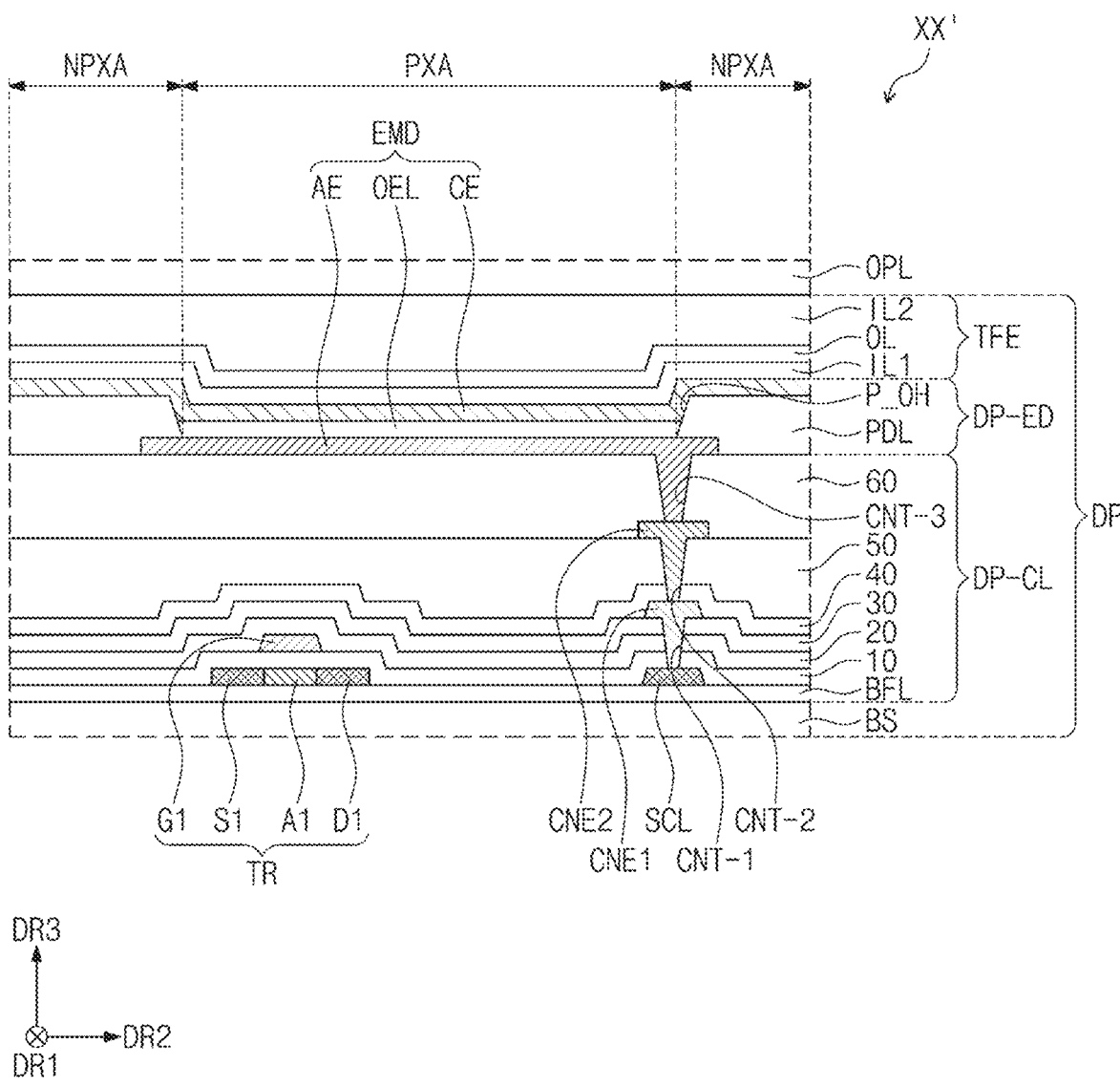
FIG. 3 is an enlarged view illustrating a region XX' of FIG. 2.

FIGS. 2 and 3 are a cross-sectional view illustrating an embodiment of a display device. More specifically, FIG. 2 is a cross-sectional view taken along line I-I' of FIG. 1. FIG. 3 is an enlarged view illustrating a region XX' of FIG. 2.

Referring to FIG. 2, the display device DD (refer to FIG. 1) may include a display panel DP, an optical layer OPL disposed on the display panel DP, and a protective member PM disposed on the optical layer OPL. Also, the display device DD may further include an adhesive layer AL disposed between the optical layer OPL and the protective member PM.

In an embodiment, the protective member PM may include a window, for example. The protective member PM may include a functional layer such as an anti-fingerprint coating layer and a hard coating layer. The protective member PM may be disposed on the uppermost portion of the display device DD and may define an exterior of the display device DD.

The adhesive layer AL may bond the optical layer OPL and the protective member PM. The adhesive layer AL may include a general adhesive such as a pressure sensitive adhesive ("PSA"), an optically clear adhesive ("OCA"), and an optical clear resin ("OCR"), and is not limited to any particular embodiment. Unlike what is illustrated in FIG. 2, the adhesive layer AL may be omitted.

The optical layer OPL may be disposed on the display panel DP to control reflected light of external light at the display panel DP. The optical layer OPL may include, e.g., a polarizing plate or a color filter layer. Although not illustrated, a light control member including quantum dots may be disposed between the display panel DP and the optical layer OPL. The light control member including quantum dots may convert or transmit light generated in a light-emitting element layer DP-ED into light having a different color.

The display panel DP may include a base layer BS, a circuit layer DP-CL disposed on the base layer BS, a light-emitting element layer DP-ED disposed on the circuit layer DP-CL, and an encapsulation layer TFE disposed on the light-emitting element layer DP-ED.

The base layer BS may be a member that provides a base surface on which a circuit layer DP-CL is disposed. The base layer BS may be a rigid substrate or a flexible substrate capable of bending, folding, rolling, or the like. The base layer BS may be a glass substrate, a metal substrate, or a polymer substrate. However, the inventive concept is not limited thereto, and the base layer BS may include an inorganic layer, an organic layer, or a composite material layer.

The base layer BS may have a multi-layer structure. In an embodiment, the base layer BS may have a three-layer structure of a synthetic resin layer, an adhesive layer, and a synthetic resin layer, for example. In particular, the synthetic resin layer may include polyimide-based resin. Also, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, a "chemical component-based" resin may be considered as including a functional group of the "chemical component".

The circuit layer DP-CL may include an insulating layer, a semiconductor pattern, a conductive pattern, a signal line, or the like. The circuit layer DP-CL may include a driving circuit of a pixel PX (refer to FIG. 4) to be described later.

The light-emitting element layer DP-ED may include a light-emitting element EMD of the pixel PX (refer to FIG. 4) to be described later. In an embodiment, the light-emitting element EMD may include an organic light-emitting material, an inorganic light-emitting material, an organic-inorganic light-emitting material, a quantum dot, a quantum rod, a micro light-emitting diode ("LED"), or a nano LED, for example.

Figure 4:
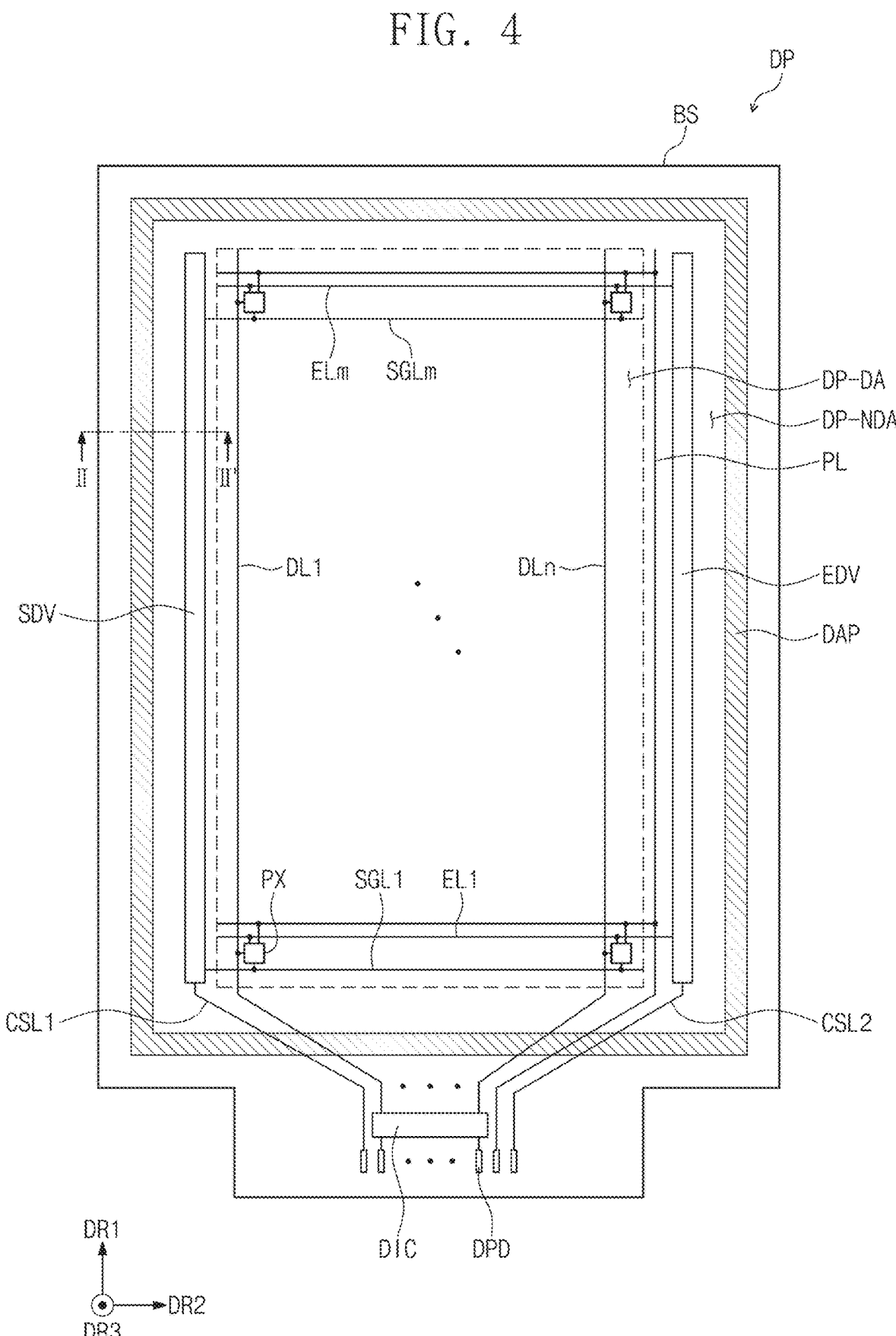
FIG. 4 is a plan view illustrating an embodiment of a portion of a display device.

FIG. 3 illustrates one transistor TR and a light-emitting element EMD included in the pixel PX (refer to FIG. 4). Referring to FIG. 3, a buffer layer BFL of the circuit layer DP-CL may be disposed on the base layer BS. The buffer layer BFL may improve a bonding force between the base layer BS and the semiconductor pattern. The buffer layer BFL may include a silicon oxide layer and a silicon nitride layer, and the silicon oxide layer and the silicon nitride layer may be alternately stacked.

The semiconductor pattern may be disposed on the buffer layer BFL. The semiconductor pattern may include poly-silicon. However, the inventive concept is not limited thereto, and the semiconductor pattern may include amorphous silicon or a metal oxide.

A source S1, an active A1, and a drain D1 of the transistor TR may be formed from the semiconductor pattern. The source S1 and the drain D1 may extend in opposite directions from the active A1 in a cross-section. FIG. 3 illustrates a portion of a connection signal line SCL formed from the semiconductor pattern. Although not illustrated separately, the connection signal line SCL may be electrically connected to the drain D1 of the transistor TR in a plan view.

A first insulating layer 10 may be disposed on the buffer layer BFL. The first insulating layer 10 may overlap the plurality of pixels in common and cover the semiconductor pattern. The first insulating layer 10 may be an inorganic layer and/or an organic layer and may have a single- or multi-layered structure. The first insulating layer 10 may include at least one of aluminum oxide, titanium oxide, silicon oxide, silicon oxynitride, zirconium oxide, and hafnium oxide.

A gate G1 of the transistor TR may be disposed on the first insulating layer 10. The gate G1 may be a portion of the metal pattern. The gate G1 may overlap the active A1. In a process of doping the semiconductor pattern, the gate G1 may function as a mask.

A second insulating layer 20 may be disposed on the first insulating layer 10 and may cover the gate G1. The second insulating layer 20 may overlap the pixels in common. The second insulating layer 20 may be an inorganic layer and/or an organic layer and may have a single- or multi-layered structure.

A third insulating layer 30 may be disposed on the second insulating layer 20. In an embodiment, the third insulating layer 30 may be a single-layered silicon oxide layer, for example.

A first connection electrode CNE1 may be disposed on the third insulating layer 30. The first connection electrode CNE1 may be connected to the connection signal line SCL via a contact hole CNT-1 that passes through the first, second, and third insulating layers 10, 20, and 30.

A fourth insulating layer 40 may be disposed on the third insulating layer 30. The fourth insulating layer 40 may be a single-layered silicon oxide layer. A fifth insulating layer 50 may be disposed on the fourth insulating layer 40. The fifth insulating layer 50 may be an organic layer.

The second connection electrode CNE2 may be disposed on the fifth insulating layer 50. The second connection electrode CNE2 may be connected to the first connection electrode CNE1 via a contact hole CNT-2 that passes through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light-emitting element layer DP-ED may include a light-emitting element EMD and a pixel defining film PDL. The light-emitting element EMD may include a first electrode AE, a light-emitting layer OEL, and a second electrode CE.

The pixel defining film PDL may be disposed on the sixth insulating layer 60 and may cover a portion of the first electrode AE. A pixel opening P_OH may be defined in the pixel defining film PDL. The pixel opening P_OH of the pixel defining film PDL may expose at least a portion of the first electrode AE. A light-emitting region PXA may be defined corresponding to a portion of the first electrode AE exposed by the pixel opening P_OH. A non-light-emitting region NPXA may surround the light-emitting region PXA.

The first electrode AE may be disposed on the sixth insulating layer 60. The first electrode AE may be connected to the second connection electrode CNE2 via a contact hole CNT-3 that passes through the sixth insulating layer 60. The first electrode AE may be a transmissive electrode, a transflective electrode, or a reflective electrode. When the first electrode AE is a transmissive electrode, the first electrode AE may include a transparent metal oxide, e.g., indium tin oxide ("ITO"), indium zinc oxide ("IZO"), zinc oxide (ZnO), indium tin zinc oxide ("ITZO"), or the like. When the first electrode AE is a transflective electrode or a reflective electrode, the first electrode AE may include Ag, Mg, Cu, Al, Pt, Pd, Au, Ni, Nd, Ir, Cr, Li, Ca, LiF/Ca (stacked structure of LiF and Ca), LiF/Al (stacked structure of LiF and Al), Mo, Ti, W, or a compound or combination (e.g., combination of Ag and Mg) including the same.

The light-emitting layer OEL may be disposed on the first electrode AE. The light-emitting layer OEL may be disposed in the pixel opening P_OH to correspond to the light-emitting region PXA. However, the inventive concept is not limited thereto, and the light-emitting layer OEL may be provided as a common layer and may correspond to the light-emitting region PXA and the non-light-emitting region NPXA. The light-emitting layer OEL may include an organic light-emitting material, an inorganic light-emitting material, an organic-inorganic light-emitting material, a quantum dot, a quantum rod, a micro-LED, or a nano LED.

The second electrode CE may be disposed on the light-emitting layer OEL. The second electrode CE may have an integral shape and may be disposed as a common layer. The second electrode CE may be a transmissive electrode, a transflective electrode, or a reflective electrode. When the second electrode CE is a transmissive electrode, the second electrode CE may include a transparent metal oxide, e.g., ITO, IZO, zinc oxide (ZnO), ITZO, or the like.

When the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, or a compound or combination (e.g., AgMg, AgYb, or MgYb) including the same. In an alternative embodiment, the second electrode CE may have a multilayer structure including a reflective or semi-transmissive film including the above material and a transparent conductive film including ITO, IZO, zinc oxide (ZnO), ITZO, or the like.

Although not illustrated, at least one of a hole injection layer, a hole transport layer, and an electron blocking layer may be disposed between the first electrode AE and the light-emitting layer OEL. At least one of an electron injection layer, an electron transport layer, and a hole blocking layer may be disposed between the light-emitting layer OEL and second electrode CE.

The encapsulation layer TFE may cover the light-emitting element layer DP-ED. The encapsulation layer TFE may include a first inorganic encapsulation film IL1, an organic encapsulation film OL disposed on the first inorganic encapsulation film IL1, and a second inorganic encapsulation film IL2 disposed on the organic encapsulation film OL. The first inorganic encapsulation film IL1 and the second inorganic encapsulation film IL2 may protect the light-emitting element layer DP-ED against moisture and/or oxygen, and the organic encapsulation film OL may protect the light-emitting element layer DP-ED against impurities such as dust particles.

In an embodiment, each of the first inorganic encapsulation film IL1 and the second inorganic encapsulation film IL2 may include silicon nitride, silicon oxynitride, silicon oxide, titanium oxide, aluminum oxide, or the like, for example, but is not particularly limited thereto. The organic encapsulation film OL may include an acrylic compound, an epoxy-based compound, or the like. The organic encapsulation film OL may include a photopolymerizable organic material and is not particularly limited.

In addition, the display device DD may include a hydrophobic coating layer PBL (refer to FIG. 5) disposed on the first inorganic encapsulation film IL1. The hydrophobic coating layer PBL (refer to FIG. 5) will be described in more detail with reference to FIG. 5.

Figure 5:
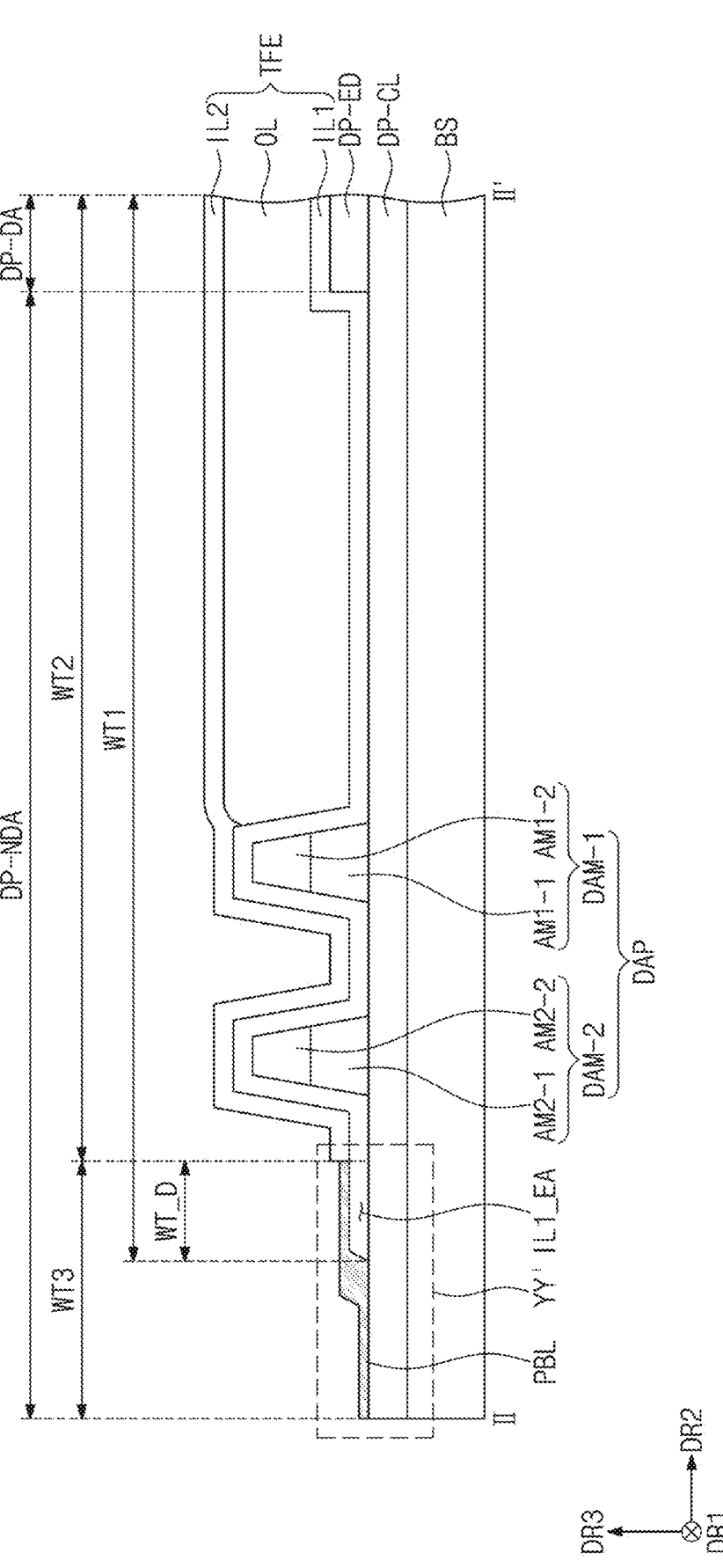
FIG. 5 is a cross-sectional view taken along line II-II' of FIG. 4.

FIG. 4 is a plan view illustrating an embodiment of a display panel. FIG. 5 is a cross-sectional view taken along line II-II' of FIG. 4.

Referring to FIG. 4, the display panel DP may include a scan driving circuit SDV, a light-emitting driving circuit EDV, a driving chip DIC, a plurality of panel signal lines SGL1 to SGLm, DL1 to DLn, EL1 to ELm, CSL1, CSL2, and PL, a plurality of pixels PX, and a plurality of display pads DPD. Here, n and m are natural numbers.

The display panel DP may be divided into a display region DP-DA and a non-display region DP-NDA. The display region DP-DA of the display panel DP may correspond to the display region DA of the display surface IS illustrated in FIG. 1. The non-display region DP-NDA of the display panel DP may correspond to the non-display region NDA of the display surface IS illustrated in FIG. 1.

In this specification, the wording, "one component and another component corresponding to each other" is not limited to having the same shape and the same area in a plan view, and includes cases having different shapes and/or different areas. The plane means a plane perpendicular to the thickness direction.

The pixels PX may overlap the display region DP-DA. Each of the pixels PX may include the light-emitting element EMD (refer to FIG. 3) and the transistor TR (refer to FIG. 3). However, the inventive concept is not limited thereto, and some of the respective components of the pixels PX may include transistors disposed in the non-display region DP-NDA.

The scan driving circuit SDV, the driving chip DIC, and the light-emitting driving circuit EDV may be disposed in the non-display region DP-NDA. The driving chip DIC may include a data driving circuit.

The panel signal lines SGL1 to SGLm, DL1 to DLn, EL1 to ELm, CSL1, CSL2, and PL may include a plurality of scan lines SGL1 to SGLm, a plurality of data lines DL1 to DLn, a plurality of emission lines EL1 to ELm, first and second control lines CSL1 and CSL2, and a power line PL. Among the panel signal lines SGL1 to SGLm, DL1 to DLn, EL1 to ELm, CSL1, CSL2, and PL, the data lines DL1 to DLn, the first and second control lines CSL1 and CSL2, and the power line PL may each be electrically connected to the plurality of display pads DPD. The pixels PX may be electrically connected to the scan lines SGL1 to SGLm, the data lines DL1 to DLn, and the emission lines EL1 to ELm.

The scan lines SGL1 to SLm may extend in the second direction DR2 and may be electrically connected to the scan driving circuit SDV. The data lines DL1 to DLn may extend in the first direction DR1 and may be electrically connected to the driving chip DIC. The emission lines EL1 to ELm may extend in the second direction DR2 and may be electrically connected to the light-emitting driving circuit EDV.

The power line PL may include a portion extending in the second direction DR2 and a portion extending in a direction inclined with respect to the second direction DR2. The portion extending in the second direction DR2 and the portion extending in the direction inclined with respect to the second direction DR2 may be disposed on different layers. The power line PL may provide a first voltage to the pixels PX.

The first control line CSL1 may be connected to the scan driving circuit SDV and may extend toward a lower end of the display panel DP. The second control line CSL2 may be connected to the light-emitting driving circuit EDV and may extend toward the lower end of the display panel DP. The lower end of the display panel DP may be included in the non-display region DP-NDA, and may be a portion having a relatively short length or small area in a plan view defined by the first direction axis DR1 and the second direction axis DR2.

The display pads DPD may be disposed on the lower end of the display panel DP. The driving chip DIC, the power line PL, the first control line CSL1, and the second control line CSL2 may be electrically connected to the display pads DPD.

The display panel DP may further include a dam structure DAP. The dam structure DAP may be disposed in the non-display region DP-NDA of the display panel DP. In a plan view defined by the first direction axis DR1 and the second direction axis DR2, the dam structure DAP may have a quadrangular (e.g., rectangular) ring shape. The dam structure DAP may surround the display region DP-DA.

Referring to FIG. 5, the dam structure DAP may be disposed on the circuit layer DP-CL. The dam structure DAP may contact the uppermost layer in the circuit layer DP-CL. In an embodiment, the dam structure DAP may contact the sixth insulating layer 60 (refer to FIG. 3), for example.

The dam structure DAP may include a first dam structure DAM-1 and a second dam structure DAM-2. However, the inventive concept is not limited thereto, and the dam structure may include three or more dam structures.

The first dam structure DAM-1 and the second dam structure DAM-2 may be sequentially arranged in a direction away from the display region DP-DA. That is, the first dam structure DAM-1 may be disposed closer to the display region DP-DA than the second dam structure DAM-2 is to the display region DP-DA, and the second dam structure DAM-2 may be spaced farther from the display region DP-DA than the first dam structure DAM-1 is from the display region DP-DA. The first dam structure DAM-1 and the second dam structure DAM-2 may be spaced apart from each other.

Each of the first dam structure DAM-1 and the second dam structure DAM-2 may include a plurality of layers. In an embodiment, the first dam structure DAM-1 may include a first base part AM1-1, and a first stacking part AM1-2 disposed on the first base part AM1-1, for example. The second dam structure DAM-2 may include a second base part AM2-1, and a second stacking part AM2-2 disposed on the second base part AM2-1.

FIG. 5 illustrates that the first dam structure DAM-1 and the second dam structure DAM-2 have similar heights, but an embodiment of inventive concept is not limited thereto. The height of the second dam structure DAM-2 may be greater than the height of the first dam structure DAM-1. The height of the first dam structure DAM-1 and the height of the second dam structure DAM-2 may be parallel to a direction in which the third direction axis DR3 extends.

The dam structure DAP may be provided to prevent the organic encapsulation film OL from overflowing. More specifically, the dam structure DAP may prevent the organic monomer resin from overflowing when the organic monomer resin is provided to form the organic encapsulation film OL.

Referring to FIG. 5, the first inorganic encapsulation film IL1 of the encapsulation layer TFE may cover the dam structure DAP. The second inorganic encapsulation film IL2 may be disposed on the first inorganic encapsulation film IL1 which covers the dam structure DAP.

In the second direction DR2 perpendicular to the thickness direction DR3, the width WT1 of the first inorganic encapsulation film IL1 may be greater than the width WT2 of the second inorganic encapsulation film IL2. An edge of the second inorganic encapsulation film IL2 may be closer to the display region DP-DA than an edge of the first inorganic encapsulation film IL1 is to the display region DP-DA. Accordingly, the first inorganic encapsulation film IL1 may include an edge region IL1_EA that does not overlap with the second inorganic encapsulation film IL2. In the first inorganic encapsulation film ILL the edge region IL1_EA may be defined as a region that does not overlap the second inorganic encapsulation film IL2. In an embodiment, a difference WT_D between the width WT1 of the first inorganic encapsulation film IL1 and the width WT2 of the second inorganic encapsulation film IL2 may be about 50 micrometers ($\mu$m) or more, for example. The organic encapsulation film OL may not overlap the edge region IL1_EA.

In the non-display region DP-NDA, the hydrophobic coating layer PBL may be disposed on the first inorganic encapsulation film IL1. More specifically, the hydrophobic coating layer PBL may be disposed on the edge region IL1_EA of the first inorganic encapsulation film IL1. The hydrophobic coating layer PBL may cover the edge region IL1_EA of the first inorganic encapsulation film IL1. In the edge region IL1_EA, the hydrophobic coating layer PBL may be directly disposed on the first inorganic encapsulation film IL1. In this specification, the wording, one component being 'directly disposed/directly provided' on another component, means that another component does not exist between one component and the other component, and that one component and the other component contact each other.

Only an inorganic material may exist on the edge region IL1_EA of the first inorganic encapsulation film IL1. Since the hydrophobic coating layer PBL may be disposed on the edge region IL1_EA of the first inorganic encapsulation film IL1 and the organic encapsulation film OL does not overlap the edge region IL1_EA of the first inorganic encapsulation film IL1, only an inorganic material may exist on the edge region IL1_EA of the first inorganic encapsulation film IL1.

In the second direction DR2 perpendicular to the thickness direction DR3, the width of the edge region IL1_EA may correspond to the difference WT_D between the width WT1 of the first inorganic encapsulation film IL1 and the width WT2 of the second inorganic encapsulation film IL2. In the second direction DR2 perpendicular to the thickness direction DR3, a width WT3 of the hydrophobic coating layer PBL may be equal to or greater than the difference WT_D between the width WT1 of the first inorganic encapsulation film IL1 and the width WT2 of the second inorganic encapsulation film IL2. In an embodiment, the width WT3 of the hydrophobic coating layer PBL may be about 50 $\mu$m or more, for example. In FIG. 5, the width WT3 of the hydrophobic coating layer PBL is greater than the difference WT_D, but an embodiment of inventive concept is not limited thereto.

In the method of manufacturing a display device in an embodiment to be described later, the hydrophobic coating layer PBL may cover the edge region IL1_EA of the first inorganic encapsulation film IL1. The hydrophobic coating layer PBL may include a fluorine group. In the method of manufacturing a display device in an embodiment to be described later, the hydrophobic coating layer PBL including a fluorine group may prevent overflow of an upper protective layer UAC (refer to FIG. 19). The upper protective layer UAC (refer to FIG. 19) may be formed after forming the hydrophobic coating layer PBL. The upper protective layer UAC (refer to FIG. 19) may be formed on the second inorganic encapsulation film IL2 through an inkjet printing method or a dispensing method. The hydrophobic coating layer PBL including a fluorine group may prevent a flow of an organic material provided to form the upper protective layer UAC (refer to FIG. 19). The wording "flow" means the phenomenon in which a material flows out of a region where the material is to be provided.

In the second direction DR2 perpendicular to the thickness direction DR3, the hydrophobic coating layer PBL may not contact the organic encapsulation film OL. The hydrophobic coating layer PBL and the organic encapsulation film OL may be spaced apart from each other. In an embodiment of the inventive concept, in the second direction DR2 perpendicular to the thickness direction DR3, the organic encapsulation film OL and the hydrophobic coating layer PBL may be spaced apart from each other with the second inorganic encapsulation film IL2 therebetween.

In addition, in the second direction DR2 perpendicular to the thickness direction DR3, the organic encapsulation film OL and the hydrophobic coating layer PBL may be spaced apart from each other with the dam structure DAP therebetween. Referring to FIG. 5, in a direction away from the display region DP-DA, the organic encapsulation film OL may be provided up to a region where the dam structure DAP is not disposed. More specifically, the organic encapsulation film OL may be disposed on the first inorganic encapsulation film IL1, and in a direction away from the display region DP-DA, the organic encapsulation film OL may be provided up to a region before a region where the first dam structure DAM-1 is disposed.

Figure 6:
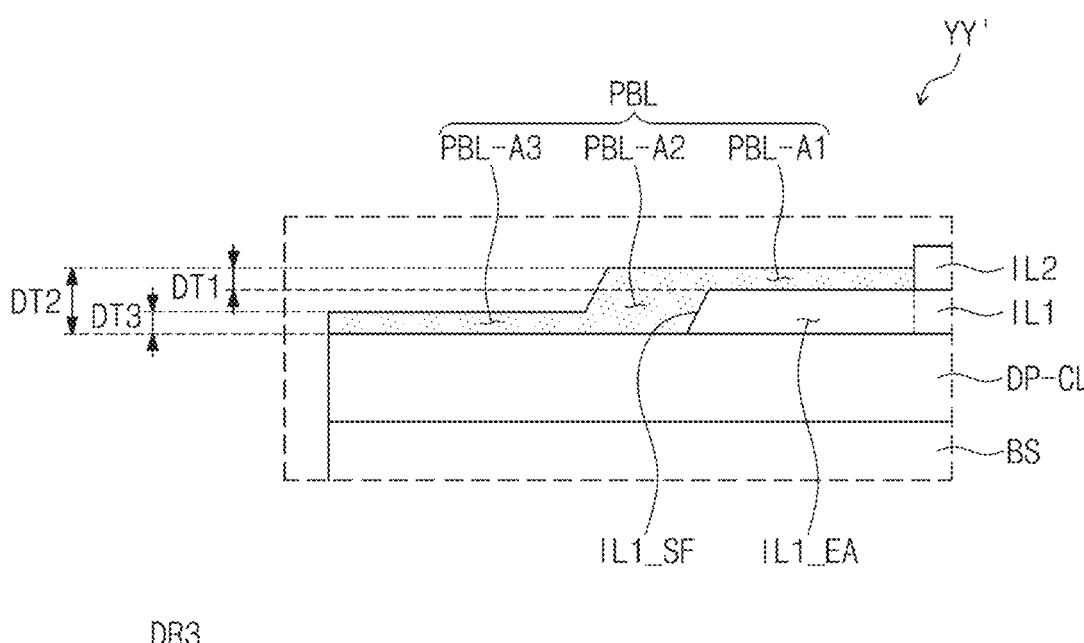
FIG. 6 is an enlarged view illustrating an embodiment of a region YY' of FIG. 5.

FIG. 6 is an enlarged view illustrating a region YY' of FIG. 5. Referring to FIG. 6, the hydrophobic coating layer PBL may cover a side surface IL1_SF of the first inorganic encapsulation film IL1. As the width WT3 of the hydrophobic coating layer PBL (refer to FIG. 5) is greater than the difference WT_D (refer to FIG. 5) between the width WT1 of the first inorganic encapsulation film IL1 (refer to FIG. 5) and the width WT2 of the second inorganic encapsulation film IL2 (refer to FIG. 5), the hydrophobic coating layer PBL may cover the side surface IL1_SF of the first inorganic encapsulation film IL1.

The hydrophobic coating layer PBL may include a first hydrophobic region PBL-A1 and a second hydrophobic region PBL-A2. The first hydrophobic region PBL-A1 may overlap the first inorganic encapsulation film IL1 and may have a first thickness DT1. The second hydrophobic region PBL-A2 may be spaced apart from the second inorganic encapsulation film IL2 with the first hydrophobic region PBL-A1 therebetween, and may have a second thickness DT2. The first thickness DT1 may be smaller than the second thickness DT2. In an embodiment, the first hydrophobic region PBL-A1 may contact the first inorganic encapsulation film IL1 and the second inorganic encapsulation film IL2, and the second hydrophobic region PBL-A2 may contact the circuit layer DP-CL, for example. Also, the first thickness DT1 of the first hydrophobic region PBL-A1 may be smaller than the thickness of the adjacent second inorganic encapsulation film IL2. The first hydrophobic region PBL-A1 may be closer to the display region DP-DA (refer to FIG. 5) than the second hydrophobic region PBL-A2 is to the display region DP-DA.

In addition, the hydrophobic coating layer PBL may further include a third hydrophobic region PBL-A3. The third hydrophobic region PBL-A3 may be spaced apart from the first hydrophobic region PBL-A1 with the second hydrophobic region PBL-A2 therebetween. In the second direction DR2 perpendicular to the thickness direction DR3, the third hydrophobic region PBL-A3, the second hydrophobic region PBL-A2, and the first hydrophobic region PBL-A1 may be sequentially disposed. FIG. 6 illustrates that the third hydrophobic region PBL-A3 has a third thickness DT3 smaller than the second thickness DT2 of the second hydrophobic region PBL-A2, but the inventive concept is not limited thereto. In an embodiment, the thickness of the third hydrophobic region PBL-A3 may be the same as the thickness of the second hydrophobic region PBL-A2, for example.

Figure 7:
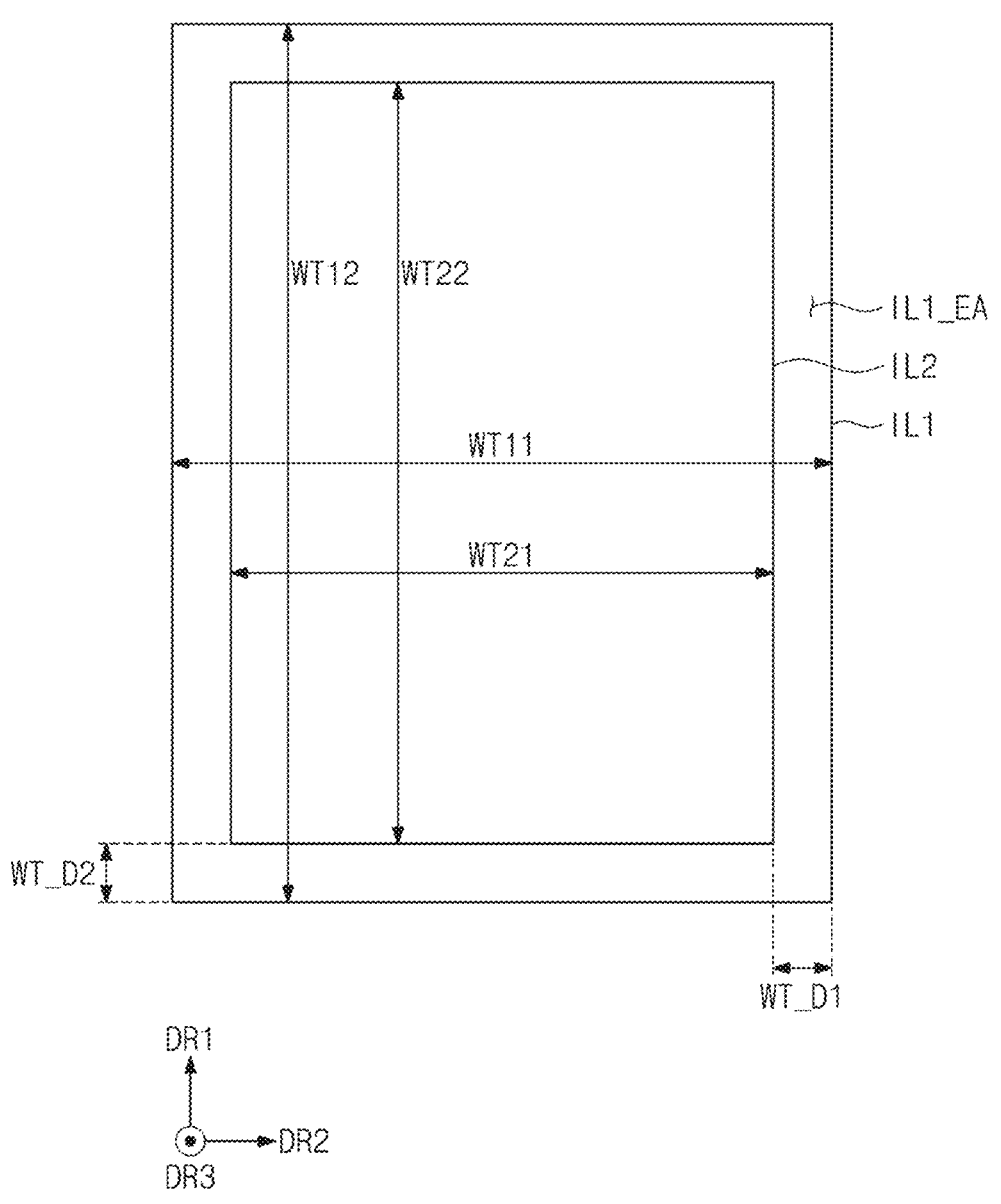
FIG. 7 is a plan view illustrating an embodiment of a portion of a display device.

FIG. 7 illustrates the first inorganic encapsulation film IL1 and the second inorganic encapsulation film IL2 in a plan view perpendicular to the thickness direction DR3. Referring to FIG. 7, in a plan view defined by the first direction axis DR1 and the second direction axis DR2, the first inorganic encapsulation film IL1 and the second inorganic encapsulation film IL2 may each have a quadrangular (e.g., rectangular) shape including two short sides and two long sides. The long sides may be parallel to the first direction axis DR1 and the short sides may be parallel to the second direction axis DR2.

On the short sides, the first inorganic encapsulation film IL1 may have a first width WT11, and on the long sides, the first inorganic encapsulation film IL1 may have a second width WT12. On the short sides, the second inorganic encapsulation film IL2 may have a third width WT21, and on the long sides, the second inorganic encapsulation film IL2 may have a fourth width WT22. The first width WT11 of the first inorganic encapsulation film IL1 and third width WT21 of the second inorganic encapsulation film IL2 may each correspond to the width of a plane including the display region DP-DA (refer to FIG. 4) and the non-display region DP-NDA (refer to FIG. 4).

On the short sides, a difference WT_D1 between the width of the first inorganic encapsulation film IL1 and the width of the second inorganic encapsulation film IL2 may be about 50 μm or more. A difference between the first width WT11 and the third width WT21 may be about 100 μm or more. That is, on one side parallel to the second direction DR2, the difference WT_D1 between the width of the first inorganic encapsulation film IL1 and the width of the second inorganic encapsulation film IL2 may be about 50 μm or more, and the sum of the differences WT_D1 in the widths of opposite sides parallel to the second direction DR2 may be about 100 μm or more.

On the long sides, a difference WT_D2 between the width of first inorganic encapsulation film IL1 and the second inorganic encapsulation film IL2 may be about 50 μm or more. The difference between the second width WT12 and the fourth width WT22 may be about 100 μm or more. That is, on one side parallel to the first direction DR1, the difference WT_D1 between the width of the first inorganic encapsulation film IL1 and the width of the second inorganic encapsulation film IL2 may be about 50 μm or more, and the sum of the differences WT_D1 in the widths of opposite sides parallel to the first direction DR1 may be about 100 μm or more. The difference WT_D1 in the width on the short sides may be the same as or different from the difference WT_D2 in the width on the long sides.

Figure 8:
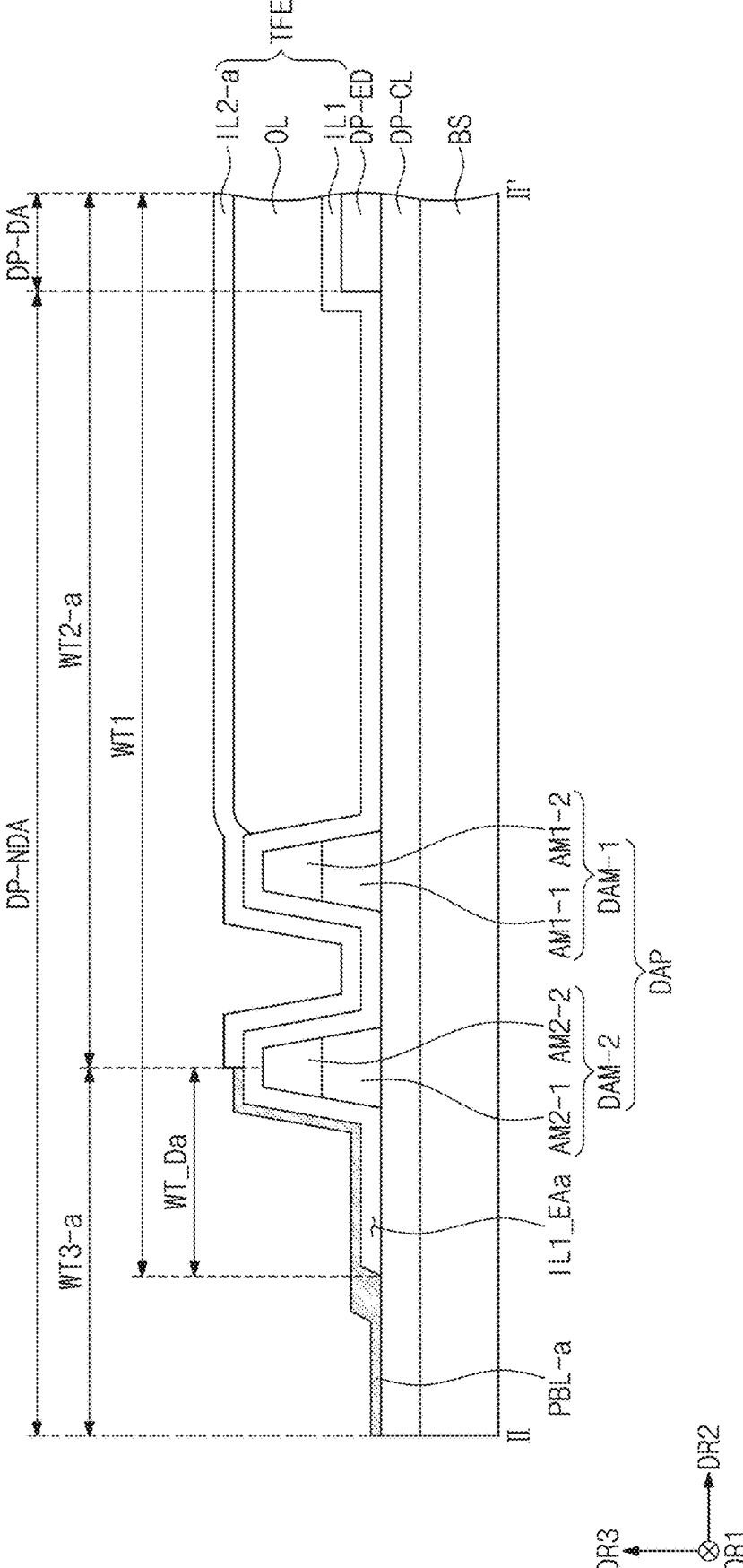
FIG. 8 is a cross-sectional view illustrating an embodiment of a portion of a display device.
Figure 9:
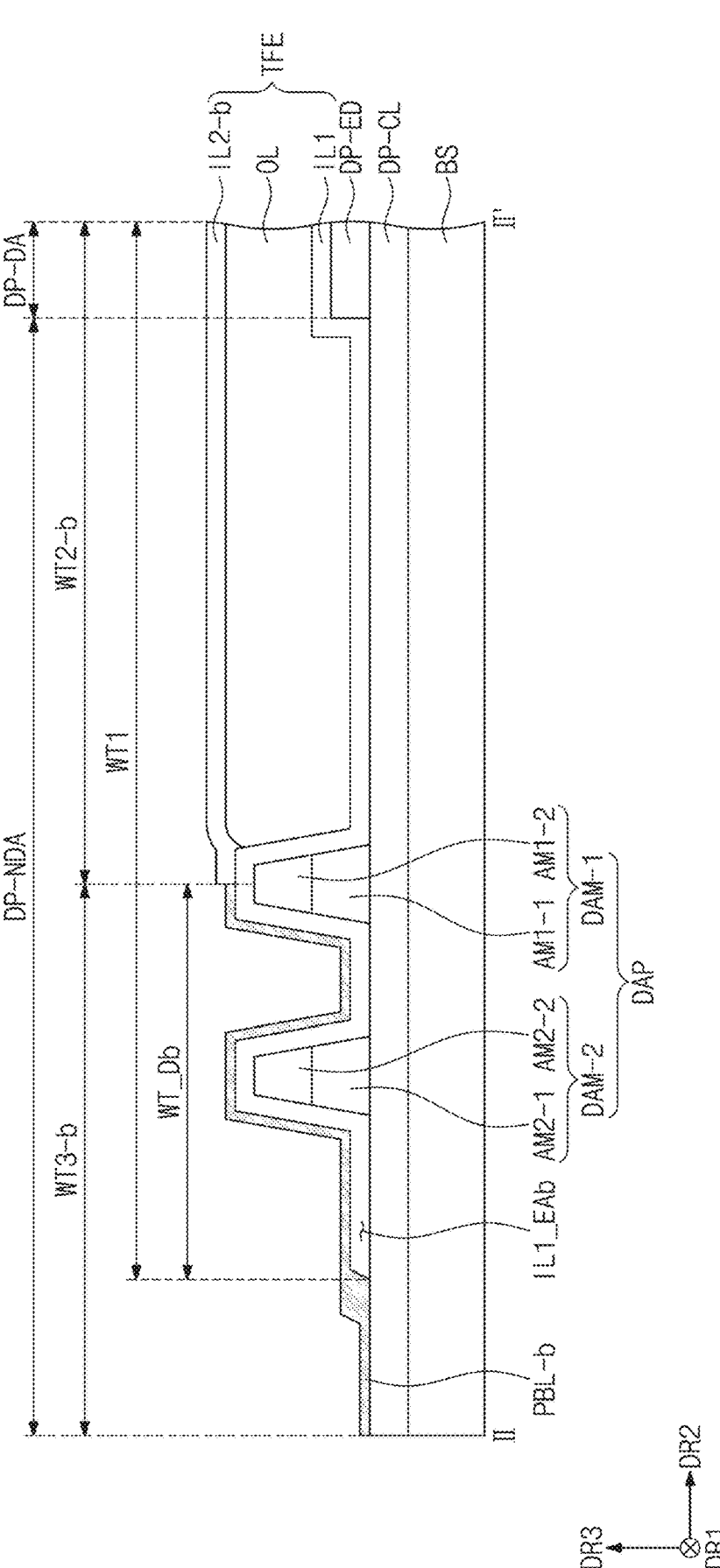
FIG. 9 is a cross-sectional view illustrating an embodiment of a portion of a display device.

FIGS. 8 and 9 are cross-sectional views illustrating an embodiment of a display device. In the descriptions of the display device in an embodiment described with reference to FIGS. 8 and 9, contents duplicated with those described with reference to FIGS. 1 to 7 are not described again, and their differences will be mainly described.

It may be understood that compared to the hydrophobic coating layer PBL described with reference to FIG. 5, a width WT3-a of a hydrophobic coating layer PBL-a in FIG. 8 is increased in a direction adjacent to the display region DP-DA. In FIG. 8, the width WT3-a of the hydrophobic coating layer PBL-a may be increased in the second direction DR2.

A hydrophobic coating layer PBL-a may cover at least a portion of the dam structure DAP. FIG. 8 illustrates that the hydrophobic coating layer PBL-a covers a portion of the second dam structure DAM-2. One edge of the hydrophobic coating layer PBL-a may be disposed on the second dam structure DAM-2.

As the width WT3-a of the hydrophobic coating layer PBL-a disposed on an edge region IL1_EAa of the first inorganic encapsulation film IL1, which does not overlap a second inorganic encapsulation film IL2-a, increases, a width WT2-a of the second inorganic encapsulation film IL2-a may decrease. Compared to the width WT2 of the second inorganic encapsulation film IL2 described with reference to FIG. 5, it may be understood that the width WT2-a of the second inorganic encapsulation film IL2-a in FIG. 8 decreases in the direction adjacent to the display region DP-DA. The width WT2-a of the second inorganic encapsulation film IL2-a in FIG. 8 may decrease in the second direction DR2 compared to the width WT2 of the second inorganic encapsulation film IL2 illustrated in FIG. 5. FIG. 8 illustrates that one edge of the second inorganic encapsulation film IL2-a is disposed on the second dam structure DAM-2.

Compared to the difference WT_D1 between the width of the first inorganic encapsulation film IL1 and the width of the second inorganic encapsulation film IL2 described with reference to FIG. 5, a difference WT_Da in the width in FIG. 8 may be increased. In the second direction DR2 perpendicular to the thickness direction DR3, as the width WT2-a of the second inorganic encapsulation film IL2-a decreases, the difference WT_Da between the width WT1 of the first inorganic encapsulation film IL1 and the width WT2-a of the second inorganic encapsulation film IL2-a may increase. The difference WT_Da between the width WT1 of the first inorganic encapsulation film IL1 and the width WT2-a of the second inorganic encapsulation film IL2-a may correspond to the width of the edge region IL1_EAa. As the width WT2-a of the second inorganic encapsulation film IL2-a decreases, the width of the edge region IL1_EAa in the first inorganic encapsulation film IL1 may increase.

It may be understood that compared to the hydrophobic coating layer PBL-a described with reference to FIG. 8, a width WT3-b of the hydrophobic coating layer PBL-b in FIG. 9 increased in a direction adjacent to the display region DP-DA. Compared to the hydrophobic coating layer PBL-a described with reference to FIG. 8, the width WT3-b of the hydrophobic coating layer PBL-b in FIG. 9 may be increased in the second direction DR2.

The hydrophobic coating layer PBL-b may cover at least a portion of the dam structure DAP. FIG. 9 illustrates that a portion of the hydrophobic coating layer PBL-b is disposed on the first dam structure DAM-1. The hydrophobic coating layer PBL-b may cover the second dam structure DAM-2 and may cover a portion of the first dam structure DAM-1. One edge of the hydrophobic coating layer PBL-b may be disposed on the first dam structure DAM-1.

As the width WT3-b of the hydrophobic coating layer PBL-b disposed on an edge region IL1_EAb of the first inorganic encapsulation film IL1, which does not overlap the second inorganic encapsulation film IL2-b, increases, a width WT2-b of the second inorganic encapsulation film IL2-b may decrease. Compared to the width WT2 of the second inorganic encapsulation film IL2-a described with reference to FIG. 8, it may be understood that the width WT2-b of the second inorganic encapsulation film IL2-b in FIG. 9 is decreased in the direction adjacent to the display region DP-DA. Compared to the width WT2-a of the second inorganic encapsulation film IL2-a described with reference to FIG. 8, the width WT2-b of the second inorganic encapsulation film IL2-b in FIG. 9 may decrease in the second direction DR2. FIG. 9 illustrates that one edge of the second inorganic encapsulation film IL2-b is disposed on the first dam structure DAM-1.

Compared to the difference WT_Da between the width WT1 of the first inorganic encapsulation film IL1 and the width WT2-a of the second inorganic encapsulation film IL2-a described with reference to FIG. 8, it may be understood that a difference WT_Db in width is increased in FIG. 9. In the second direction DR2 perpendicular to the thickness direction DR3, as the width WT2-b of the second inorganic encapsulation film IL2-b decreases, the difference WT_Db between the width WT1 of the first inorganic encapsulation film IL1 and the width WT2-b of the second inorganic encapsulation film IL2-b may increase. The difference WT_Db between the width WT1 of the first inorganic encapsulation film IL1 and the width WT2-b of the second inorganic encapsulation film IL2-b may correspond to the width of the edge region IL1_EAb. As the width WT2-b of the second inorganic encapsulation film IL2-b decreases, the width of the edge region IL1_EAb in the first inorganic encapsulation film IL1 may increase.

Unlike the configuration illustrated in FIGS. 8 and 9, one edge of the hydrophobic coating layers PBL-a and PBL-b may be disposed on the first inorganic encapsulation film IL1 between the first dam structure DAM-1 and the second dam structure DAM-2. In an embodiment, the positions at which the hydrophobic coating layers PBL, PBL-a, and PBL-b cover the edge regions IL1_EA, IL1_EAa, and IL1_EAb of the first inorganic encapsulation film IL1 may change depending on the edge regions IL1_EA, IL1_EAa, IL1_EAb of the first inorganic encapsulation film IL1, and are not limited thereto.

Figure 10:
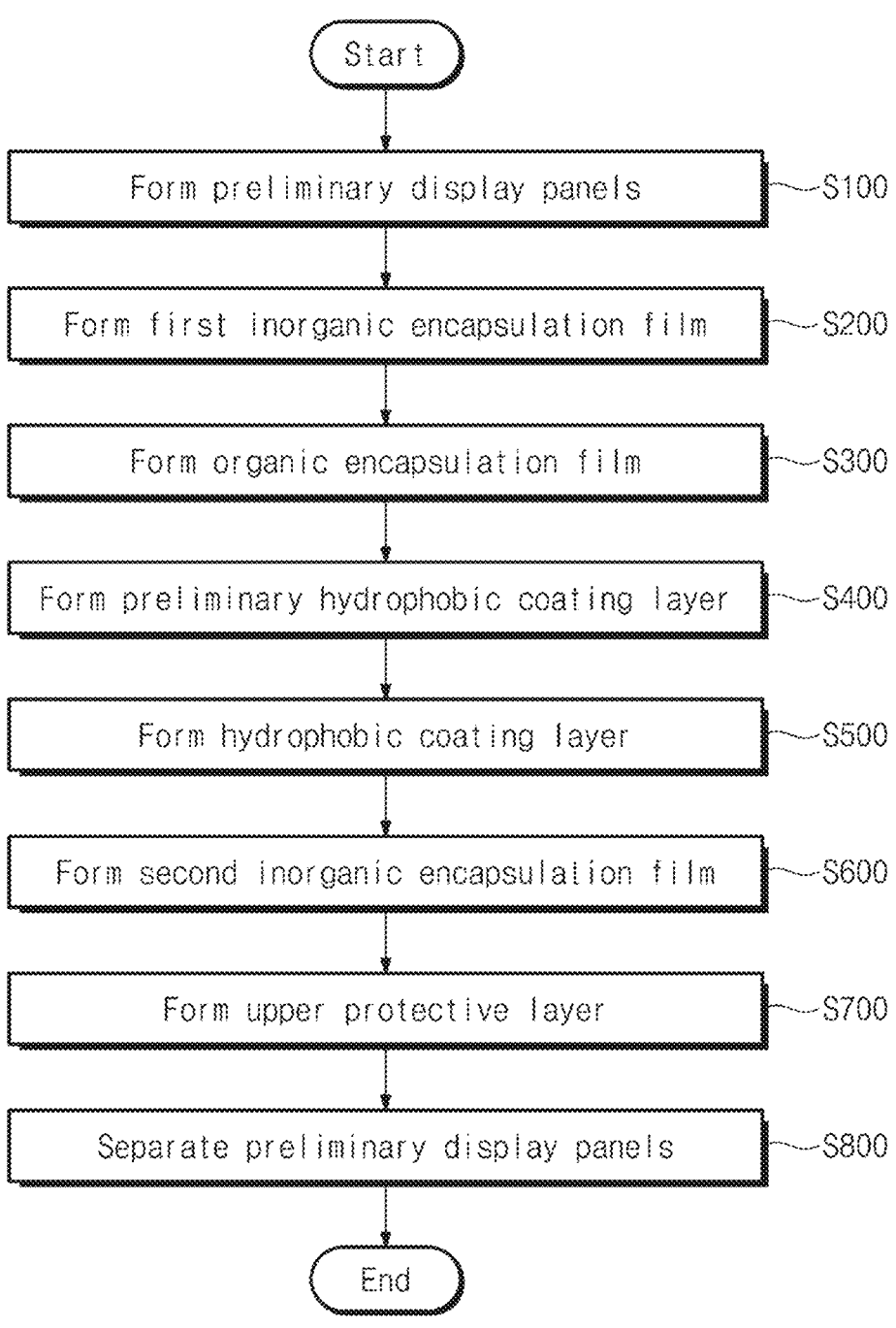
FIG. 10 is a flowchart showing an embodiment of a method of manufacturing a display device.

The display device in the embodiment may be manufactured by the method of manufacturing the display device. FIG. 10 is a flowchart showing a method of manufacturing a display device in an embodiment, and FIGS. 11 to 19 schematically illustrate a display device manufacturing process. Hereinafter, in the description of a method of manufacturing a display device in an embodiment described with reference to FIGS. 10 to 19, contents duplicated with those described with reference to FIGS. 1 to 9 are not described again, but their differences will be mainly described.

A method of manufacturing a display device in an embodiment of the inventive concept may include forming a plurality of preliminary display panels on a substrate (S100), forming a first inorganic encapsulation film (S200), forming an organic encapsulation film on the first inorganic encapsulation film (S300), forming a preliminary hydrophobic coating layer on the organic encapsulation film (S400), forming a hydrophobic coating layer (S500), forming a second inorganic encapsulation film on the first inorganic encapsulation film (S600), forming an upper protective layer on the second inorganic encapsulation film (S700), and separating each of the preliminary display panels (S800). The display device DD manufactured by the method of manufacturing the display device in an embodiment may include an organic encapsulation film OL (refer to FIG. 5) and a hydrophobic coating layer PBL (refer to FIG. 5) which are spaced apart from each other with the second inorganic encapsulation film IL2 (refer to FIG. 5) therebetween.

Figure 11:
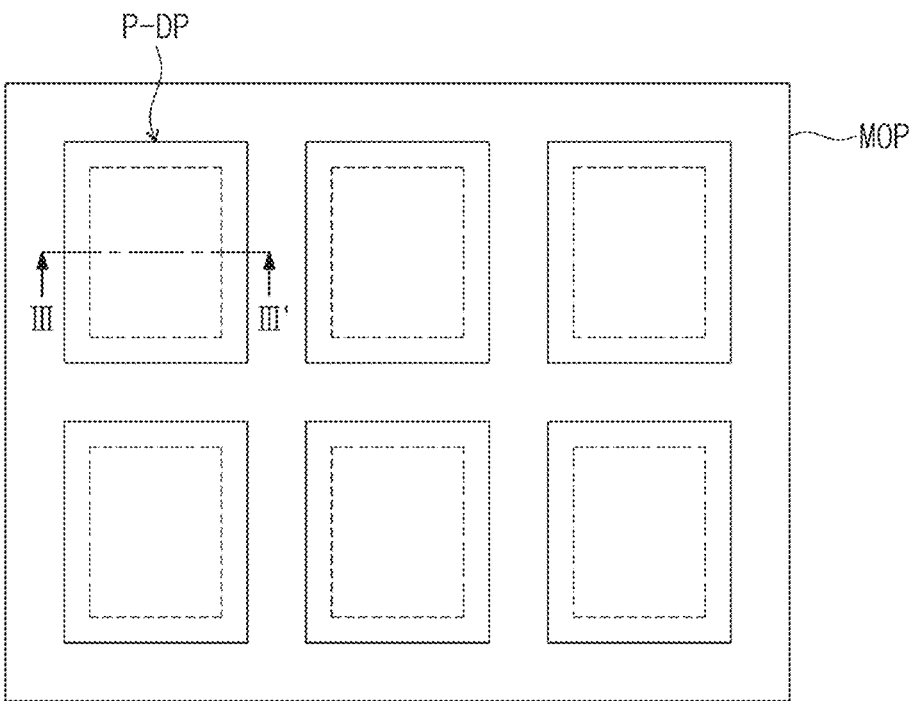
FIG. 11 is a plan view schematically illustrating an embodiment of a display device manufacturing process.
Figure 11:
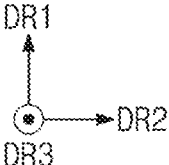

FIG. 11 illustrates a carrier substrate MOP including preliminary display panels P-DP. It is illustrated that the carrier substrate MOP includes three preliminary display panels P-DP in each of the first row and second row of the carrier substrate. However, this is merely one of embodiments. The arrangement shape of the preliminary display panels P-DP and the number of the preliminary display panels P-DP are not limited to any particular embodiment.

Figure 12:
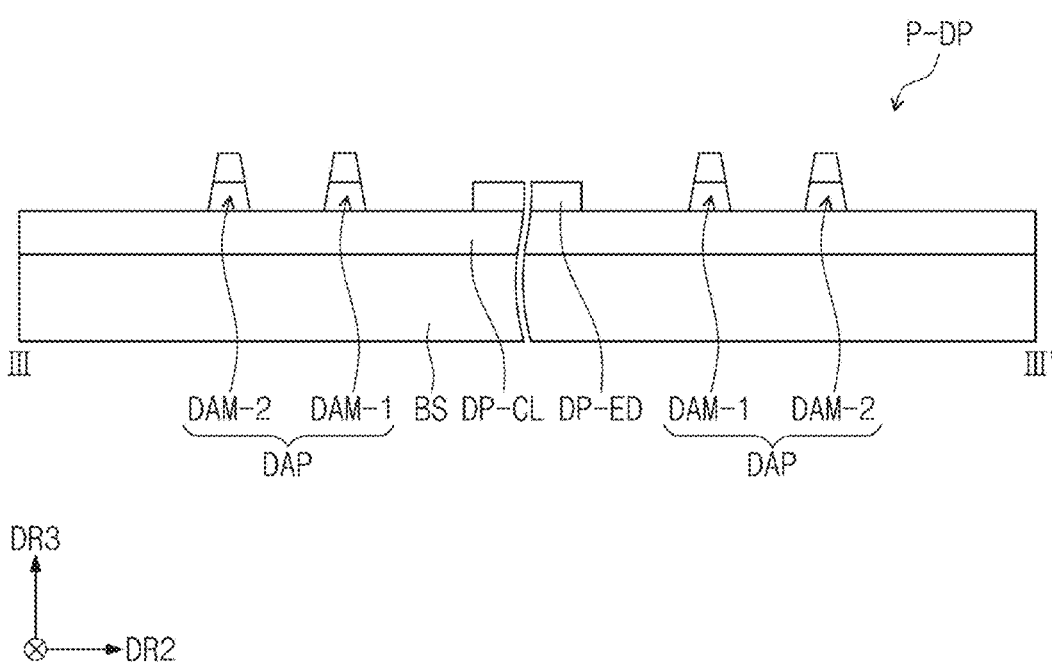
FIG. 12 is a cross-sectional view schematically illustrating an embodiment of a display device manufacturing process.

FIG. 12 is a cross-sectional view taken along line III-III' of FIG. 11, and is a cross-sectional view of a preliminary display panel P-DP. The preliminary display panel P-DP may include a base layer BS, a circuit layer DP-CL disposed on the base layer BS, and a light-emitting element layer DP-ED disposed on the circuit layer DP-CL. In addition, the preliminary display panel P-DP may further include a dam structure DAP disposed on the circuit layer DP-CL. The dam structure DAP may include a first dam structure DAM-1 and a second dam structure DAM-2.

Figure 13:
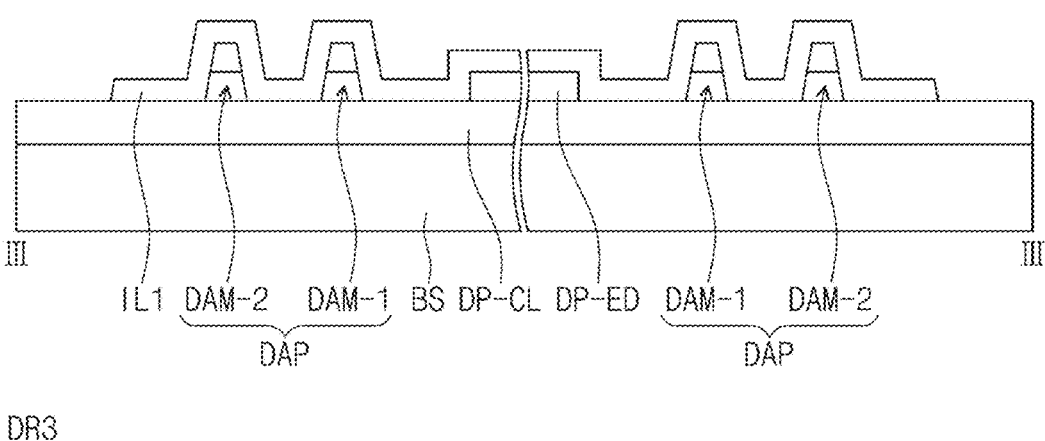
FIG. 13 is a cross-sectional view schematically illustrating an embodiment of a display device manufacturing process.
Figure 13:
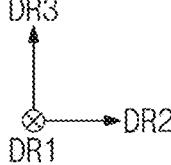

FIG. 13 illustrates a process of forming the first inorganic encapsulation film IL1 on the light-emitting element layer DP-ED. The first inorganic encapsulation film IL1 may cover the light-emitting element layer DP-ED and the dam structure DAP. The first inorganic encapsulation film IL1 may include silicon nitride, silicon oxynitride, silicon oxide, titanium oxide, or aluminum oxide. In an embodiment, the first inorganic encapsulation film IL1 may include silicon oxynitride, for example. The first inorganic encapsulation film IL1 may be formed through a chemical vapor deposition ("CVD") method.

Figure 14:
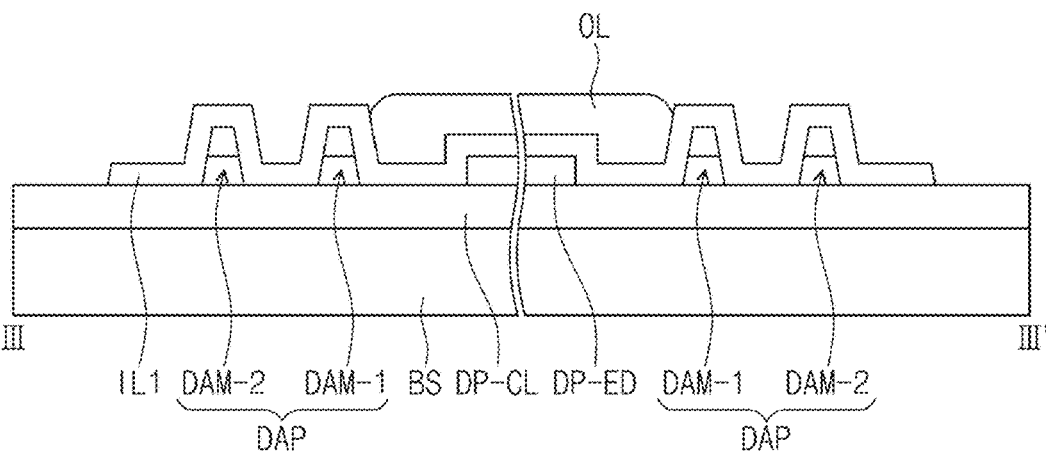
FIG. 14 is a cross-sectional view schematically illustrating an embodiment of a display device manufacturing process.
Figure 14:
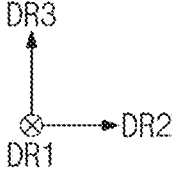

FIG. 14 illustrates a process of forming the organic encapsulation film OL on the first inorganic encapsulation film IL1. In a plan view defined by the first direction axis DR1 and the second direction axis DR2, the organic encapsulation film OL may be disposed in the dam structure DAP. The organic encapsulation film OL may be formed by providing an organic monomer resin. In an embodiment, the organic monomer resin may include an acrylic resin and/or an epoxy-based resin, for example. In a plan view defined by the first direction axis DR1 and the second direction axis DR2, the organic encapsulation film OL may have a smaller area than that of the first inorganic encapsulation film IL1. In addition, in a plan view defined by the first direction axis DR1 and the second direction axis DR2, the organic encapsulation film OL may have a smaller area than that of the second inorganic encapsulation film IL2 (refer to FIG. 17).

Figure 15:
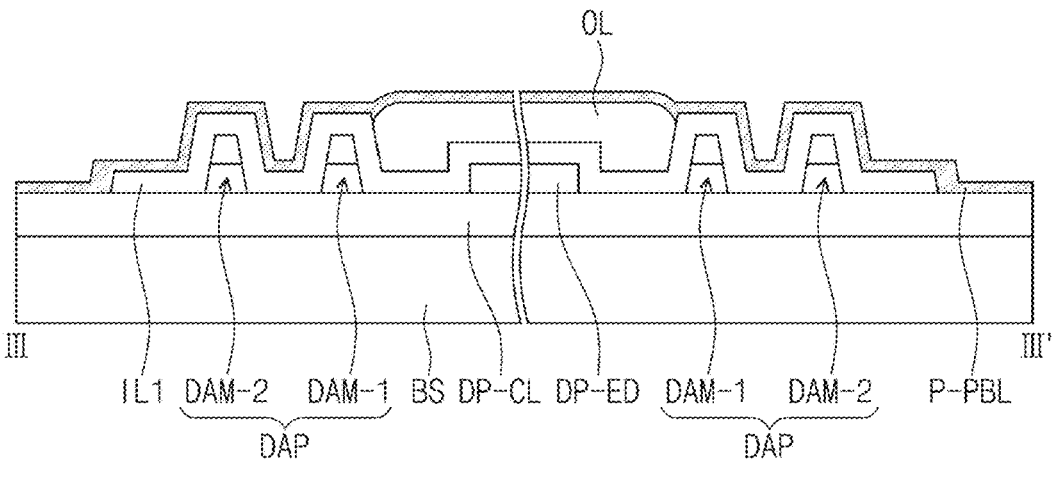
FIG. 15 is a cross-sectional view schematically illustrating an embodiment of a display device manufacturing process.
Figure 15:
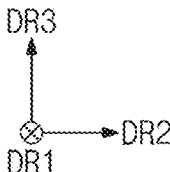

FIG. 15 illustrates a process of forming a preliminary hydrophobic coating layer P-PBL on the organic encapsulation film OL. The preliminary hydrophobic coating layer P-PBL may cover the organic encapsulation film OL. Also, the preliminary hydrophobic coating layer P-PBL may cover a region in which the organic encapsulation film OL is not formed in the first inorganic encapsulation film IL1. In a plan view defined by the first direction axis DR1 and the second direction axis DR2, an area of the preliminary hydrophobic coating layer P-PBL may be greater than an area of the first inorganic encapsulation film IL1.

The preliminary hydrophobic coating layer P-PBL may be formed by providing a hydrophobic gas including a fluorine group. In an embodiment, the hydrophobic gas including a fluorine group may include at least one of $NF_3$, $CF_4$, and $SF_6$, for example. However, this is merely one of embodiments, and the hydrophobic gas that is provided during formation of the preliminary hydrophobic coating layer P-PBL may be used without limitation as long as the hydrophobic gas includes a fluorine group. The preliminary hydrophobic coating layer P-PBL may be formed through a plasma method. More specifically, the preliminary hydrophobic coating layer P-PBL may be formed by supplying radio frequency power ("RF") to a remote plasma source chamber ("RPSC"). However, this is merely one of embodiments, and a method of forming the preliminary hydrophobic coating layer P-PBL is not limited thereto.

Figure 16:
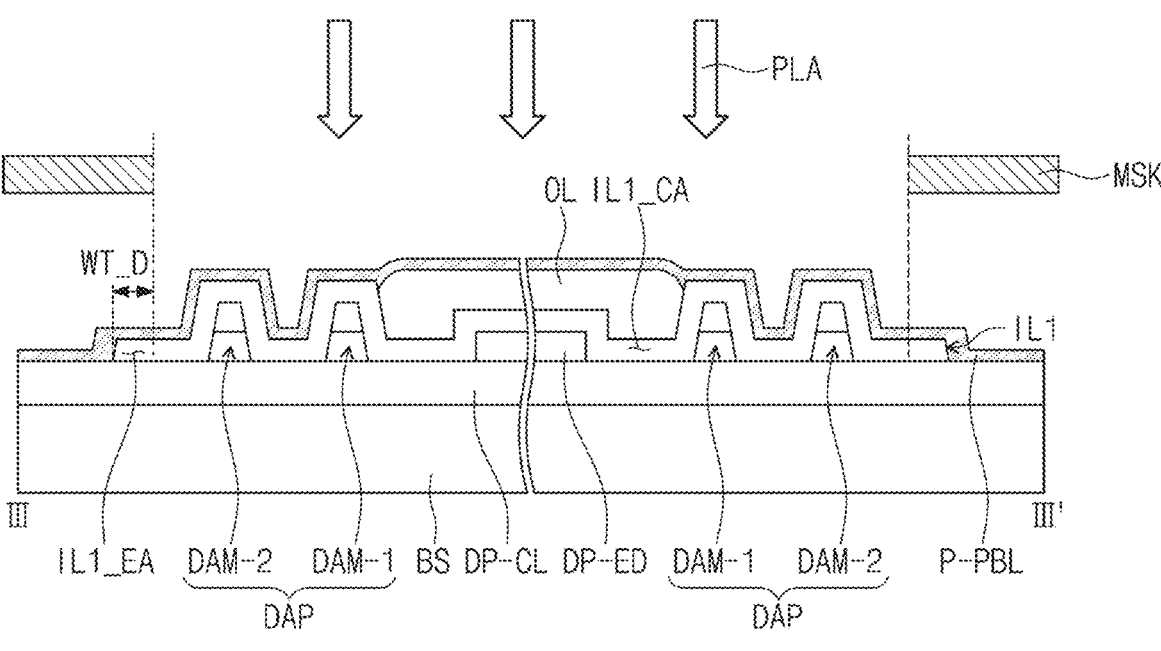
FIG. 16 is a cross-sectional view schematically illustrating an embodiment of a display device manufacturing process.
Figure 16:
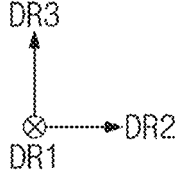
Figure 17:
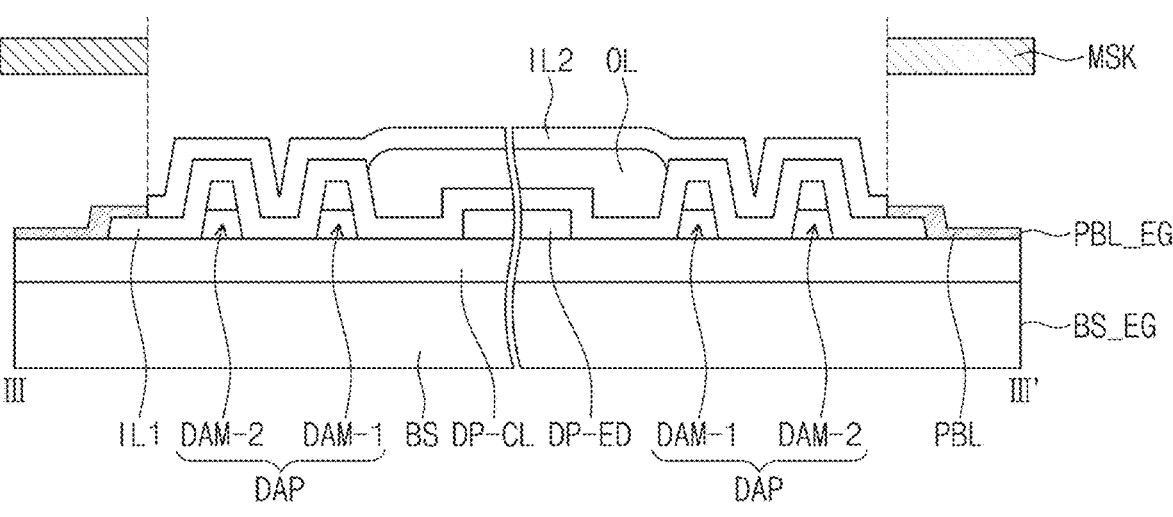
FIG. 17 is a cross-sectional view schematically illustrating an embodiment of a display device manufacturing process.
Figure 17:
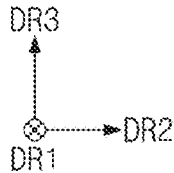

FIGS. 16 and 17 illustrate a process of forming a hydrophobic coating layer PBL from the preliminary hydrophobic coating layer P-PBL. In the first inorganic encapsulation film IL1, the preliminary hydrophobic coating layer P-PBL disposed in a central region IL1_CA except for the edge region IL1_EA may be removed. The preliminary hydrophobic coating layer P-PBL may not be removed in the edge region IL1_EA of the first inorganic encapsulation film IL1 since a mask is provided on the edge region IL1_EA of the first inorganic encapsulation film IL1. In the second direction DR2 perpendicular to the thickness direction DR3, the width WT_D of the edge region IL1_EA of the first inorganic encapsulation film IL1 may be about 50 μm or more.

In the central region IL1_CA of the first inorganic encapsulation film ILL the preliminary hydrophobic coating layer P-PBL may be removed through a plasma method. When the preliminary hydrophobic coating layer P-PBL is removed, hydrogen gas or nitrogen gas may be provided as a source of a plasma PLA. However, this is merely one of embodiments, and the material provided during removal of the preliminary hydrophobic coating layer P-PBL is not limited thereto.

In the forming of the hydrophobic coating layer PBL from the preliminary hydrophobic coating layer P-PBL, the surface of the first inorganic encapsulation film IL1 is partially removed, so that the thickness of the first inorganic encapsulation film IL1 may differ in one region than in other regions. However, since the difference between the thickness in the one region and the thickness in the other regions except for the one region is about 2% or less, the first inorganic encapsulation film IL1 having a substantially uniform thickness may be provided.

Referring to FIG. 17, an edge PBL_EG of the hydrophobic coating layer PBL may be parallel to an edge BS_EG of the base layer BS. The edge PBL_EG of the hydrophobic coating layer PBL and the edge BS_EG of the base layer BS may coincide with a cutting line of each of the preliminary display panels P-DP. In the second direction DR2 perpendicular to the thickness direction DR3, the hydrophobic coating layer PBL may be formed up to the cutting line of each of the preliminary display panels P-DP.

After the hydrophobic coating layer PBL is formed, the second inorganic encapsulation film IL2 may be formed. The second inorganic encapsulation film IL2 may be formed on the organic encapsulation film OL and the first inorganic encapsulation film IL1 that do not overlap the hydrophobic coating layer PBL. The second inorganic encapsulation film IL2 may include silicon nitride, silicon oxynitride, silicon oxide, titanium oxide, or aluminum oxide. In an embodiment, the second inorganic encapsulation film IL2 may include silicon nitride, for example. The second inorganic encapsulation film IL2 may be formed through a CVD method. In the forming of the second inorganic encapsulation film IL2, the mask MSK that is provided in the forming of the hydrophobic coating layer PBL may be provided in the same manner.

The second inorganic encapsulation film IL2 may cover the organic encapsulation film OL. The second inorganic encapsulation film IL2 may be formed on the first inorganic encapsulation film IL1 that do not overlap the hydrophobic coating layer PBL. Accordingly, in a plan view perpendicular to the thickness direction DR3, an area of the second inorganic encapsulation film IL2 may be smaller than an area of the first inorganic encapsulation film IL1. More specifically, in a plan view defined by the first direction axis DR1 and the second direction axis DR2, the area of second inorganic encapsulation film IL2 may be smaller than an area of the first inorganic encapsulation film IL1.

Figure 18:
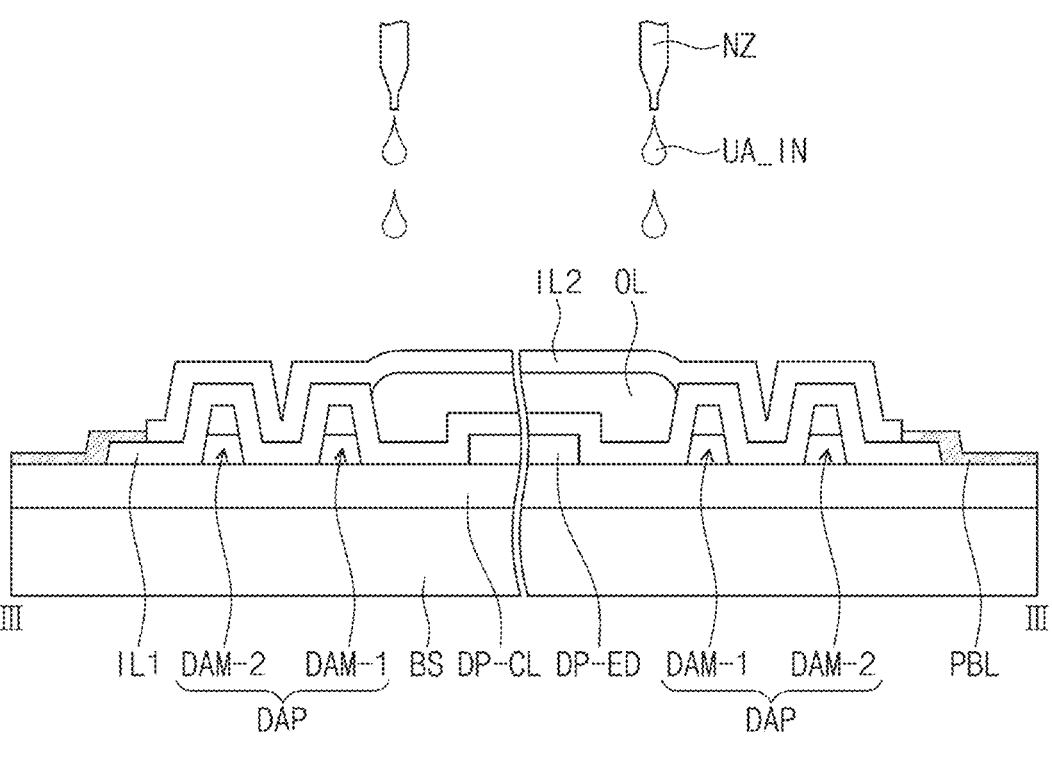
FIG. 18 is a cross-sectional view schematically illustrating an embodiment of a display device manufacturing process.
Figure 18:
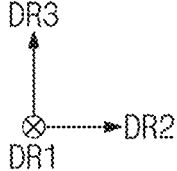
Figure 19:
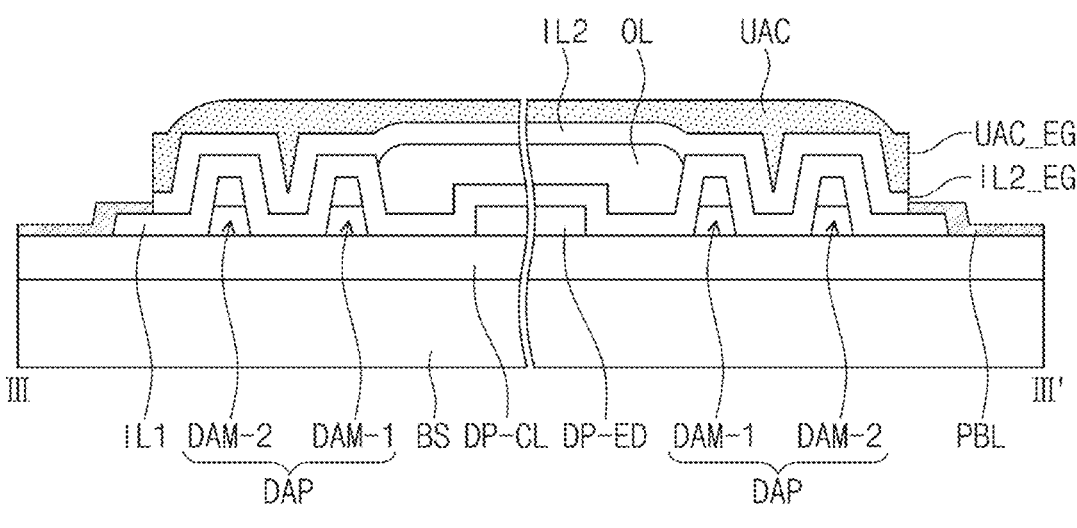
FIG. 19 is a cross-sectional view schematically illustrating an embodiment of a display device manufacturing process.
Figure 19:
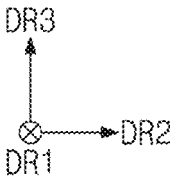

FIGS. 18 and 19 illustrate forming an upper protective layer UAC on the second inorganic encapsulation film IL2. The upper protective layer UAC may be formed by providing an organic material UA_IN. In an embodiment, the upper protective layer UAC may include an epoxy-based compound, an acrylic compound, or the like, for example, but is not particularly limited thereto. The organic material UA_IN may be provided directly on the second inorganic encapsulation film IL2 through an inkjet printing method or a dispensing method. When the upper protective layer UAC is formed through the inkjet printing method or the dispensing method, manufacturing efficiency of the upper protective layer UAC formed over a large area may be improved. Although FIG. 18 illustrates that the organic material UA_IN is provided through a nozzle NZ, a method of providing the organic material UA_IN is not limited thereto.

Referring to FIG. 19, the upper protective layer UAC may not overlap the hydrophobic coating layer PBL. In the thickness direction DR3, an edge UAC_EG of the upper protective layer UAC may be parallel to an edge IL2_EG of the second inorganic encapsulation film IL2. The upper protective layer UAC may cover the second inorganic encapsulation film IL2. More specifically, the upper protective layer UAC may cover a region up to the second inorganic encapsulation film IL2 disposed on the dam structure DAP.

The upper protective layer UAC may be a temporary protective member provided to protect components disposed below the upper protective layer UAC. After the upper protective layer UAC is formed and each of the preliminary display panels P-DP is separated, the upper protective layer UAC may be removed. Also, after the upper protective layer UAC is removed, the optical layer OPL (refer to FIG. 2) may be disposed on the second inorganic encapsulation film IL2. In an embodiment, the optical layer OPL (refer to FIG. 2) may be directly disposed on the hydrophobic coating layer PBL, for example.

Table 1 below shows measurement results of wetting distance in Comparative Examples and Experimental Examples. In Experimental Examples 1 and 2, samples, in which two layers of silicon oxynitride are formed on a glass substrate, and a hydrophobic coating layer including a fluorine group is formed in an edge region, are prepared, an organic material is provided into the hydrophobic coating layer, and then the wetting distance of the organic material is measured. The wetting distance of the organic material is obtained by measuring the length by which the organic material has flowed out of the region where the organic material to be provided. In Comparative Examples 1 and 2, samples are prepared in the same manner as in Experimental Examples 1 and 2 except that the hydrophobic coating layer was not formed. In Comparative Example 1 and Experimental Example 1, an organic material is provided to a thickness of 4 μm, and in Comparative Example 2 and Experimental Example 2, an organic material is provided to a thickness of 8 μm. The results in Table 1 are evaluated with a contact surface profiler used for alpha-step analysis.

TABLE 1

| Classification | Comparative Example 1 | Experi- mental Example 1 | Comparative Example 2 | Experi- mental Example 2 |
|---|---|---|---|---|
| Wetting distance | 104 µm | 0 µm | 90 µm | 0 µm |

Referring to Table 1, it may be understood that in Experimental Examples 1 and 2, the flow of organic matter did not occur as compared to Comparative Examples 1 and 2. In Experimental Examples 1 and 2, a hydrophobic coating layer including a fluorine group is formed. Accordingly, in an embodiment, it is considered that a method of manufacturing a display device including forming a hydrophobic coating layer on the first inorganic encapsulation film will improve the manufacturing reliability of the display device. In addition, it is considered that the display device formed by the method of manufacturing the display device in an embodiment and including the hydrophobic coating layer will exhibit excellent reliability.

A method of manufacturing a display device in an embodiment of the inventive concept may include forming a first inorganic encapsulation film on a light-emitting element layer of each of preliminary display panels, forming an organic encapsulation film on the first inorganic encapsulation film, forming a preliminary hydrophobic coating layer on the organic encapsulation film, forming a hydrophobic coating layer by removing the preliminary hydrophobic coating layer in a central region of the first inorganic encapsulation film except for an edge region of the first inorganic encapsulation film, forming a second inorganic encapsulation film which covers the organic encapsulation film on the first inorganic encapsulation film, forming an upper protective layer on the second inorganic encapsulation film, and separating each of the preliminary display panels. The upper protective layer may be formed through an inkjet printing method or a dispensing method. The upper protective layer formed through the inkjet printing method or the dispensing method may be easily formed in a large area. The method of manufacturing a display device in an embodiment may include the forming of the preliminary hydrophobic coating layer and the forming of the hydrophobic coating layer and may thus prevent flow of an organic material provided during formation of the upper protective layer. Accordingly, the method of manufacturing a display device in an embodiment, which includes forming a preliminary hydrophobic coating layer and forming a hydrophobic coating layer, may improve the manufacturing reliability of the display device. The display device in an embodiment manufactured by the method of manufacturing a display device in an embodiment may exhibit excellent reliability.

The display device in an embodiment may include a light-emitting element layer, a first inorganic encapsulation film disposed on the light-emitting element layer, an organic encapsulation film disposed on the first inorganic encapsulation film, a second inorganic encapsulation film which covers the organic encapsulation film and is disposed on the first inorganic encapsulation film, and a hydrophobic coating layer which covers an edge region of the first inorganic encapsulation film and is disposed on the first inorganic encapsulation film. The edge region may be defined as a region in which the first inorganic encapsulation film and the second inorganic encapsulation film do not overlap. In one direction perpendicular to the thickness direction, the hydrophobic coating layer and the organic encapsulation film may be spaced apart from each other with the second inorganic encapsulation film therebetween. Since the hydrophobic coating layer covers the edge region of the first inorganic encapsulation film, an area of the first inorganic encapsulation film may be greater than an area of the second inorganic encapsulation film in a plan view perpendicular to the thickness direction.

A method of manufacturing a display device in an embodiment of the inventive concept may include forming a hydrophobic coating layer before forming an upper protective layer, thereby improving the manufacturing reliability of the display device.

A display device in an embodiment of the inventive concept may include a hydrophobic coating layer disposed on a first inorganic encapsulation film, thereby improving the reliability of the display device.

Although the embodiments of the invention have been described, it is understood that the invention should not be limited to these embodiments but various changes and modifications may be made by one ordinary skilled in the art within the spirit and scope of the invention as hereinafter claimed.

What is claimed is:

1. An electronic device divided into a display region and a non-display region adjacent to the display region, the electronic device comprising:
   a base layer;
   a light-emitting element layer disposed on the base layer;
   a first inorganic encapsulation film disposed on the light-emitting element layer;
   an organic encapsulation film disposed on the first inorganic encapsulation film;
   a second inorganic encapsulation film which covers the organic encapsulation film and is disposed on the first inorganic encapsulation film; and
   a hydrophobic coating layer which covers an edge region of the first inorganic encapsulation film, is disposed on the first inorganic encapsulation film and does not overlap the second inorganic encapsulation film,
   wherein the edge region is defined as a region in which the first inorganic encapsulation film and the second inorganic encapsulation film do not overlap, and
   in a direction perpendicular to a thickness direction, the organic encapsulation film and the hydrophobic coating layer are spaced apart from each other with the second inorganic encapsulation film therebetween.

2. The electronic device of claim 1, wherein the hydrophobic coating layer comprises a fluorine group.

3. The electronic device of claim 1, wherein on a cross section perpendicular to the thickness direction, a width of the first inorganic encapsulation film parallel to the direction is greater than a width of the second inorganic encapsulation film parallel to the direction.

4. The electronic device of claim 3, wherein on a side parallel to the direction, a difference between the width of the first inorganic encapsulation film and the width of the second inorganic encapsulation film is about 50 micrometers or more.

5. The electronic device of claim 3, wherein in the direction, a difference between the width of the first inorganic encapsulation film and the width of the second inorganic encapsulation film is less than or equal to a width of the hydrophobic coating layer.

6. The electronic device of claim 1, wherein in the edge region, the hydrophobic coating layer is directly disposed on the first inorganic encapsulation film.

7. The electronic device of claim 1, wherein the organic encapsulation film does not overlap the edge region.

8. The electronic device of claim 1, wherein the hydrophobic coating layer comprises:

a first hydrophobic region overlapping the first inorganic encapsulation film and having a first thickness; and a second hydrophobic region having a second thickness and spaced apart from the second inorganic encapsulation film with the first hydrophobic region therebetween, the first thickness being less than the second thickness.

9. The electronic device of claim 1, further comprising a dam structure disposed on the base layer in the non-display region, wherein the first inorganic encapsulation film covers the dam structure.

10. The electronic device of claim 9, wherein the hydrophobic coating layer and the organic encapsulation film are spaced apart from each other with the dam structure therebetween.

11. The electronic device of claim 9, wherein the hydrophobic coating layer covers at least a portion of the dam structure.

\*  \*  \*  \*  \*